(12) United States Patent  
Goto

(10) Patent No.: US 8,193,621 B2
(45) Date of Patent: Jun. 5, 2012

(54) SEMICONDUCTOR DEVICE

(75) Inventor: Yoshiaki Goto, Nishikasugai-gun (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 13/167,296

(22) Filed: Jun. 23, 2011

(65) Prior Publication Data

US 2011/0248395 A1 Oct. 13, 2011

Related U.S. Application Data

(62) Division of application No. 12/140,658, filed on Jun. 17, 2008, now Pat. No. 7,989,932.

(30) Foreign Application Priority Data

Jun. 18, 2007 (JP) ................................. 2007-159942

(51) Int. Cl.
H01L 23/495 (2006.01)
H01L 23/48 (2006.01)
H01L 23/52 (2006.01)
H01L 29/40 (2006.01)

(52) U.S. Cl. ........................................ 257/676; 257/666
(58) Field of Classification Search .................... 257/666
See application file for complete search history.

(56) References Cited

U.S. PATENT DOCUMENTS

| | | | |
|---|---|---|---|
| 4,951,124 A | 8/1990 | Sawaya | |
| 5,336,927 A | 8/1994 | Suetake | |
| 5,969,412 A * | 10/1999 | Matsutomo | 257/670 |
| 6,121,673 A * | 9/2000 | Kinsman | 257/670 |
| 6,541,311 B1 * | 4/2003 | Hauser et al. | 438/123 |
| 7,199,458 B2 | 4/2007 | Lee | |
| 7,298,025 B2 * | 11/2007 | Johnson | 257/666 |
| 7,576,416 B2 | 8/2009 | Tu et al. | |
| 2002/0030254 A1 * | 3/2002 | Corisis | 257/667 |
| 2003/0122262 A1 | 7/2003 | Masuda et al. | |
| 2004/0145042 A1 * | 7/2004 | Morita et al. | 257/692 |
| 2005/0156294 A1 | 7/2005 | Johnson | |
| 2005/0156300 A1 * | 7/2005 | Johnson | 257/678 |
| 2007/0023875 A1 | 2/2007 | Okane et al. | |
| 2007/0085176 A1 | 4/2007 | Tu et al. | |
| 2007/0102801 A1 | 5/2007 | Ishida et al. | |
| 2008/0073758 A1 * | 3/2008 | James | 257/666 |

FOREIGN PATENT DOCUMENTS

| | | |
|---|---|---|
| JP | 62-037955 | 2/1987 |
| JP | 62-37955 | 2/1987 |
| JP | 63-107159 | 5/1988 |
| JP | 2000-77595 | 3/2000 |
| JP | 2007-35865 | 2/2007 |
| JP | 2007-134486 | 5/2007 |

OTHER PUBLICATIONS

U.S. Appl. No. 13/231,039, filed Sep. 13, 2011, Goto.

* cited by examiner

Primary Examiner — Kiesha Bryant
Assistant Examiner — Jeremy Joy
(74) Attorney, Agent, or Firm — Oblon, Spivak, McClelland, Maier & Neustadt, L.L.P.

(57) ABSTRACT

A semiconductor device includes a lead frame including inner lead portion having inner leads connected to outer leads and relay inner leads not connected to the outer leads. A semiconductor element is mounted on a lower surface of the lead frame. Electrode pads of the semiconductor element are connected to the inner lead portion via metal wire. One end of the relay inner lead is connected to the electrode pad via the metal wire, and the other end is connected to the outer lead via a relay metal wire disposed to step over the inner lead.

7 Claims, 25 Drawing Sheets

SEMICONDUCTOR DEVICE

CROSS-REFERENCE TO RELATED APPLICATIONS

This application is a divisional of U.S. application Ser. No. 12/140,658 filed on Jun. 17, 2008, and is based upon and claims the benefit of priority from the prior Japanese Patent Application No. 2007-159942, filed on Jun. 18, 2007; the entire contents of each of which are incorporated herein by reference.

BACKGROUND OF THE INVENTION

1. Field of the Invention

The present invention relates to a semiconductor device.

2. Description of the Related Art

To realize miniaturization and high-density mounting of the semiconductor device, a semiconductor package (semiconductor device) in which a plurality of semiconductor elements are stacked and sealed in one package is in practical use. In the semiconductor package (TSOP or the like) using a lead frame, the plurality of semiconductor elements are stacked on the lead frame in order, and electrode pads of the respective semiconductor elements are electrically connected to lead portions of the lead frame via bonding wires (metal wires).

When semiconductor elements are mounted on a single surface of the lead frame, a lead frame which has been subjected to depress process so that its element mounting portion is lower than the lead portion is used in order to increase the number of semiconductor elements to be mounted. The depress process is a factor of increasing the manufacturing cost of the lead frame and thus the manufacturing cost of the semiconductor package. Further, the depress-processed lead frame has an inclined portion and therefore has a limit in size of the mountable semiconductor element.

It has also been considered to mount a plurality of semiconductor elements stacked respectively on both surfaces of the lead frame (see JP-A 2007-035865 (KOKAI)). In this case, the semiconductor elements are resin-molded while mounted on both surfaces of the lead frame, so that the filling performance of the sealing resin deteriorates depending on the arrangement of the pads of the semiconductor elements and on the shape of the lead frame associated with the arrangement. In terms of the above points, it is desired to mount the semiconductor elements stacked in multiple tiers only on a single surface of the lead frame. However, a conventional semiconductor device employing the single-surface stack structure has a problem such as an increase in manufacturing cost due to the depress process or a limit in element size or the like.

Further, since the arrangement order of the inner leads of the lead frame basically corresponds to that of the outer leads, the lead frame can cope with limited circuits. More specifically, since the lead frame is fabricated by forming lead patterns on one metal plate, the inner leads cannot be made cross each other. When bonding wires are made cross each other, the bonding wires can come into contact with each other to short out. Accordingly, it is impossible to make the arrangement order of the electrode pads of the semiconductor element different from that of the outer leads.

To such a point, a lead frame in which between a die pad portion and an inner lead, a relay conductor electrically insulated from them is provided is described in JP-A 2000-077595 (KOKAI). When a lead frame in which a re-wiring conductor is disposed separately from the inner lead is used, an increase in package size is unavoidable. Since the element size and the package size become close to each other accompanying the increase in size of the semiconductor, it is demanded to suppress the increase in package size while coping with various circuits by the lead frame.

SUMMARY OF THE INVENTION

A semiconductor device according to an aspect of the present invention includes: a lead frame including outer lead portion having a plurality of outer leads and inner lead portion having inner leads connected to the outer leads and relay inner leads not connected to the outer leads; a semiconductor element group including at least one semiconductor element mounted on a lower surface side of the lead frame and having electrode pads; connecting metal wire which electrically connects the inner lead portion and the electrode pads of the semiconductor element; and a resin sealing portion which seals the semiconductor element group together with the connecting metal wires, one end of the relay inner lead being electrically connected to the electrode pad of the semiconductor element via the connecting metal wire, and another end of the relay inner lead being electrically connected to the outer lead via a relay metal wire disposed to step over the inner lead.

A semiconductor device according to another aspect of the present invention includes: a lead frame including outer lead portion having a plurality of outer leads and inner lead portion having a plurality of inner leads; a semiconductor element group including at least one semiconductor element mounted on a lower surface side of the lead frame and having electrode pads; metal wire which electrically connects the inner lead portions and the electrode pads of the semiconductor element; and a resin sealing portion which seals the semiconductor element group together with the metal wire, the outer leads located at both ends in an arrangement direction of the outer lead portion having positioning projections which are provided below dambar cut portions respectively and projected outward in the arrangement direction.

A semiconductor device according to still another aspect of the present invention includes: a lead frame including outer leads and inner leads; a semiconductor element group including at least one semiconductor element mounted on a lower surface side of the lead frame and having electrode pads; metal wire which electrically connects the inner leads and the electrode pads of the semiconductor element; and a resin sealing portion which seals the semiconductor element group together with the metal wire, the outer lead having a portion projecting from the resin sealing portion to support the resin sealing portion, and the projecting portion having an S-shape.

A semiconductor device according to still another aspect of the present invention includes: a lead frame including outer leads and inner leads; a semiconductor element adhered to the lead frame via an adhesive film and having electrode pads; metal wire which electrically connects the inner leads and the electrode pads of the semiconductor element; and a resin sealing portion which seals the semiconductor element together with the metal wire, the adhesive film having a base film, a lead frame adhesive layer formed on one of surfaces of the base film, and a semiconductor element adhesive layer formed on another surface of the base film and having a cure temperature higher than that of the lead frame adhesive layer.

DESCRIPTION OF THE EMBODIMENTS

Hereinafter, embodiments for carrying out a semiconductor device of the present invention will be described.

Figure 1:
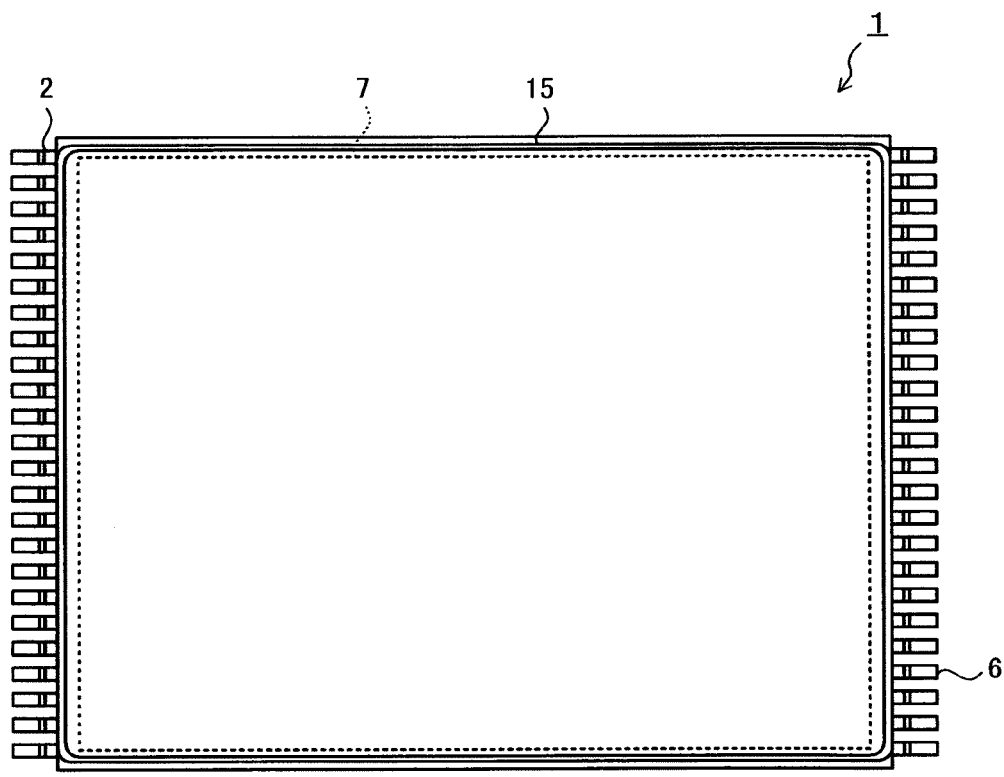
FIG. 1 is a plan view showing a semiconductor device according to a first embodiment of the present invention.
Figure 2:
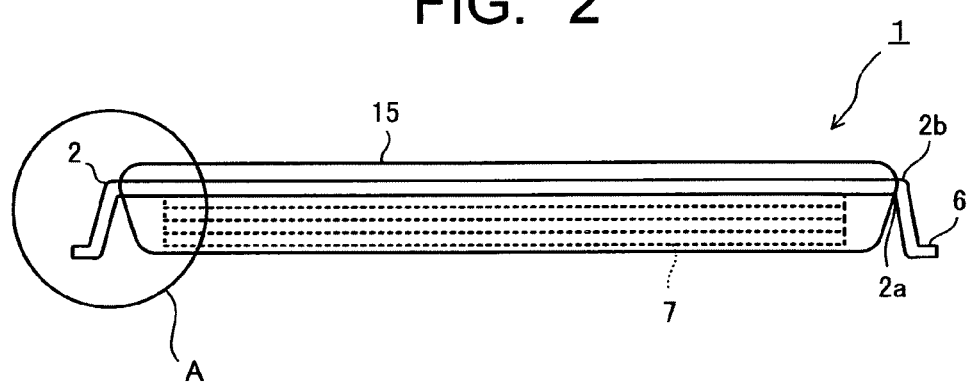
FIG. 2 is a front view of the semiconductor device shown in FIG. 1.
Figure 3:
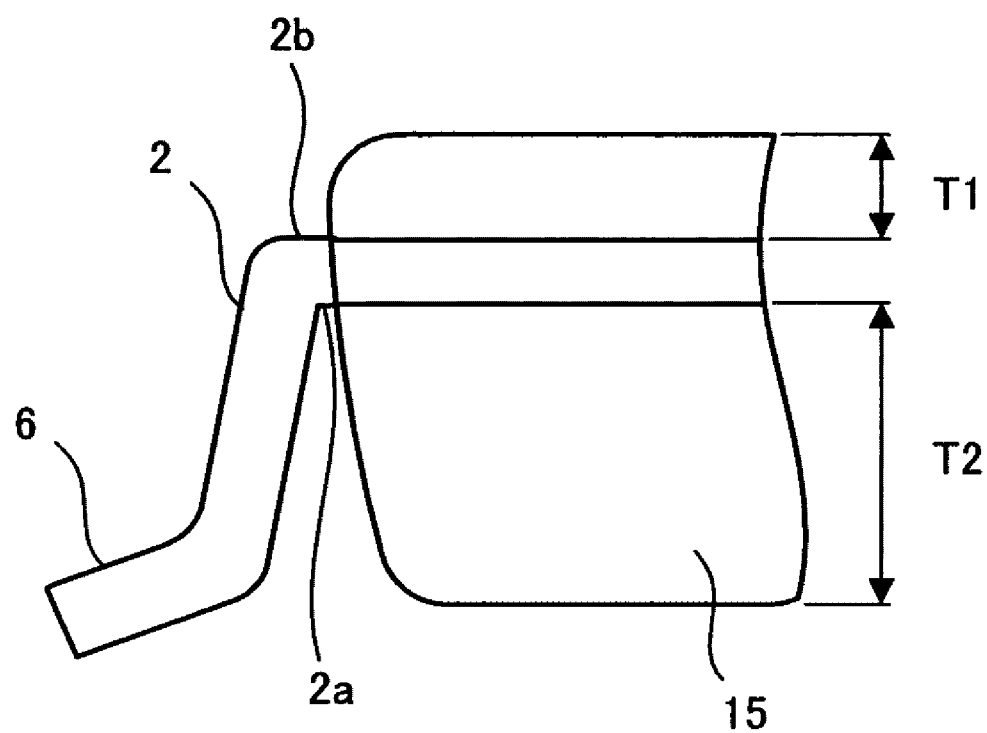
FIG. 3 is an enlarged view showing an A portion in FIG. 2.
Figure 4:
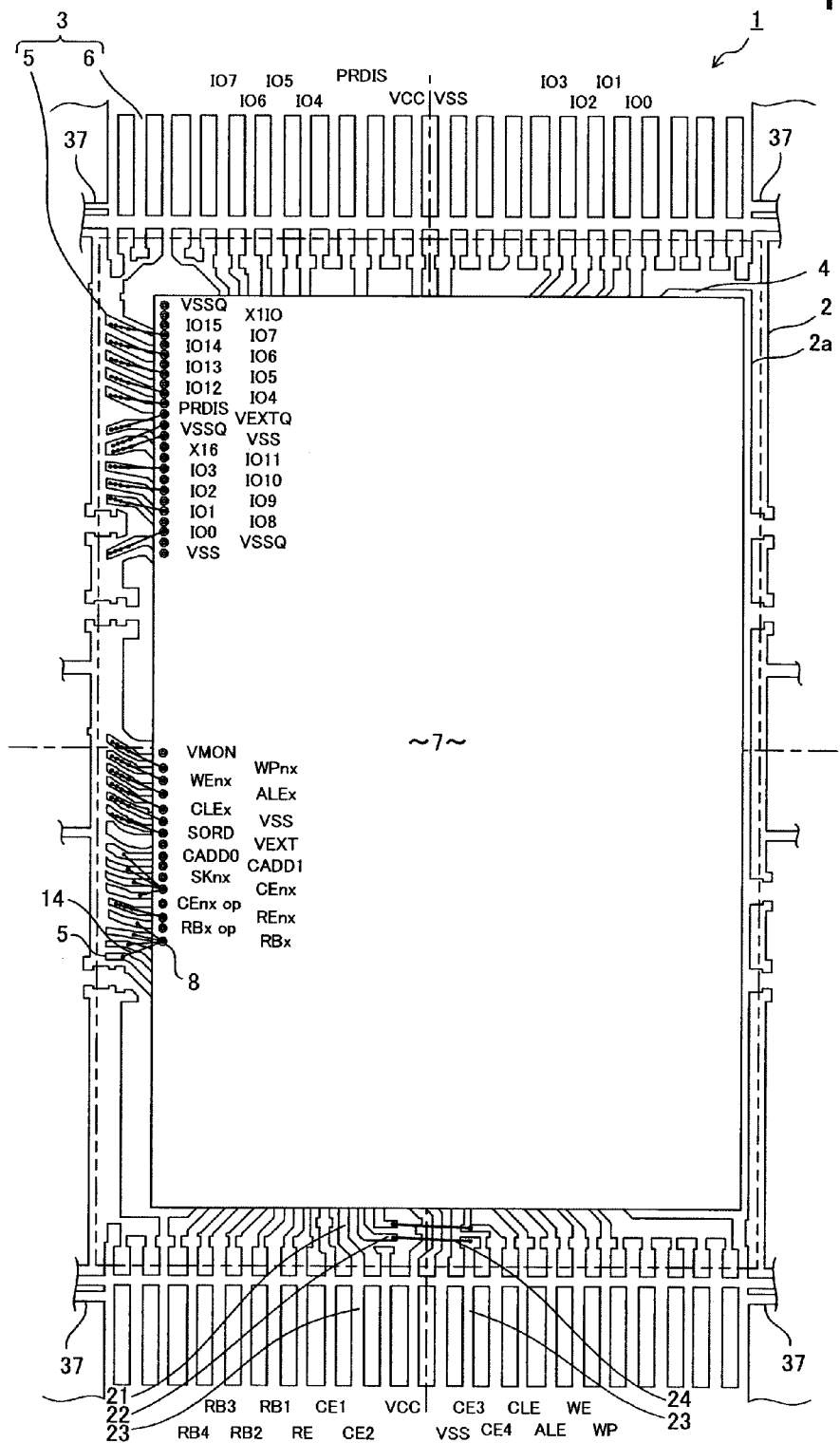
FIG. 4 is a plan view showing a state of a semiconductor element mounted on a lead frame in the semiconductor device shown in FIG. 1.
Figure 5:
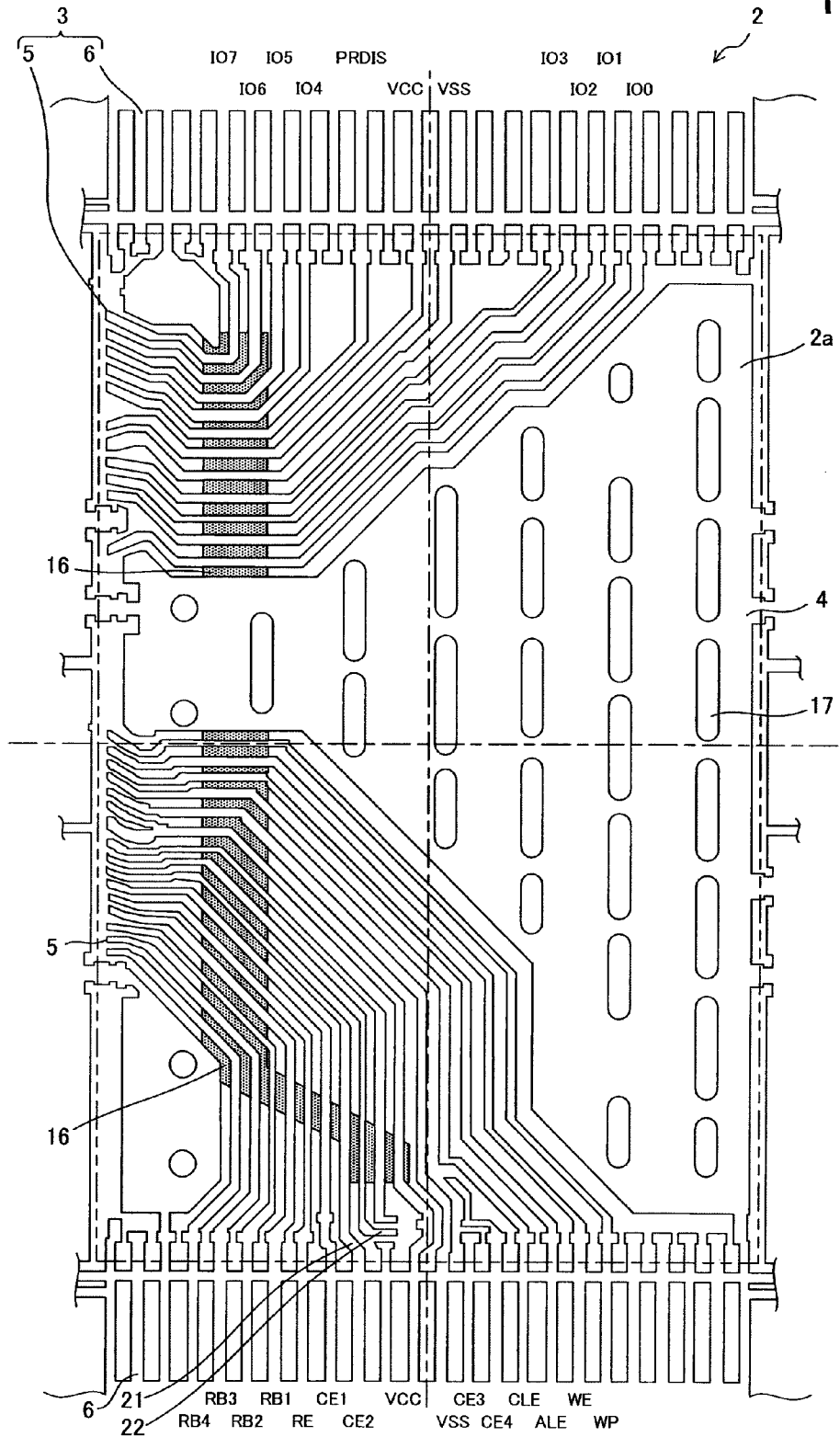
FIG. 5 is a plan view showing the lead frame of the semiconductor device shown in FIG. 1.
Figure 6:
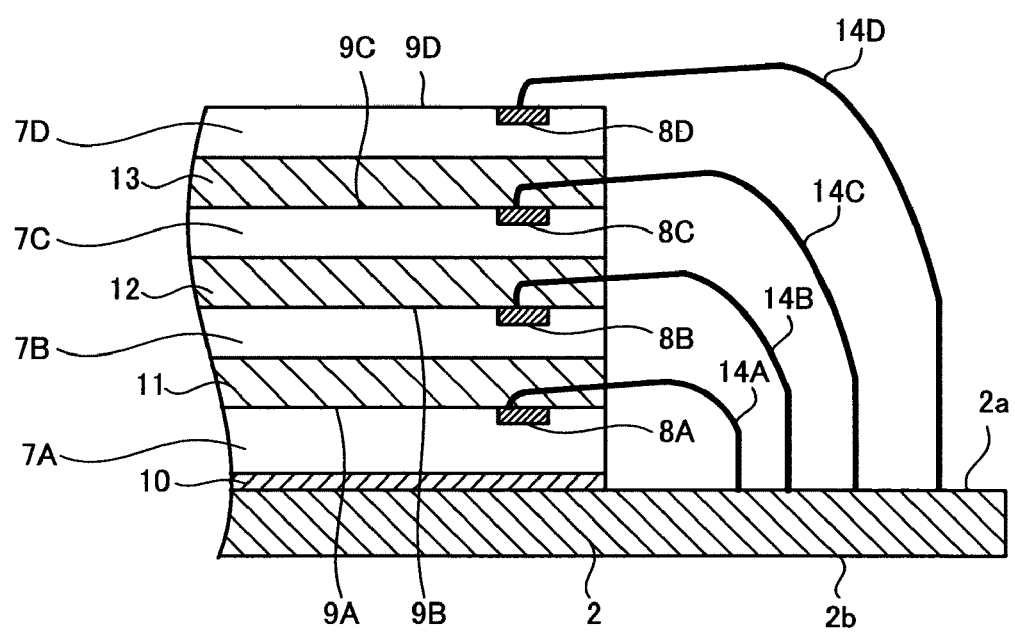
FIG. 6 is an enlarged sectional view showing a portion in FIG. 4.
Figure 9:
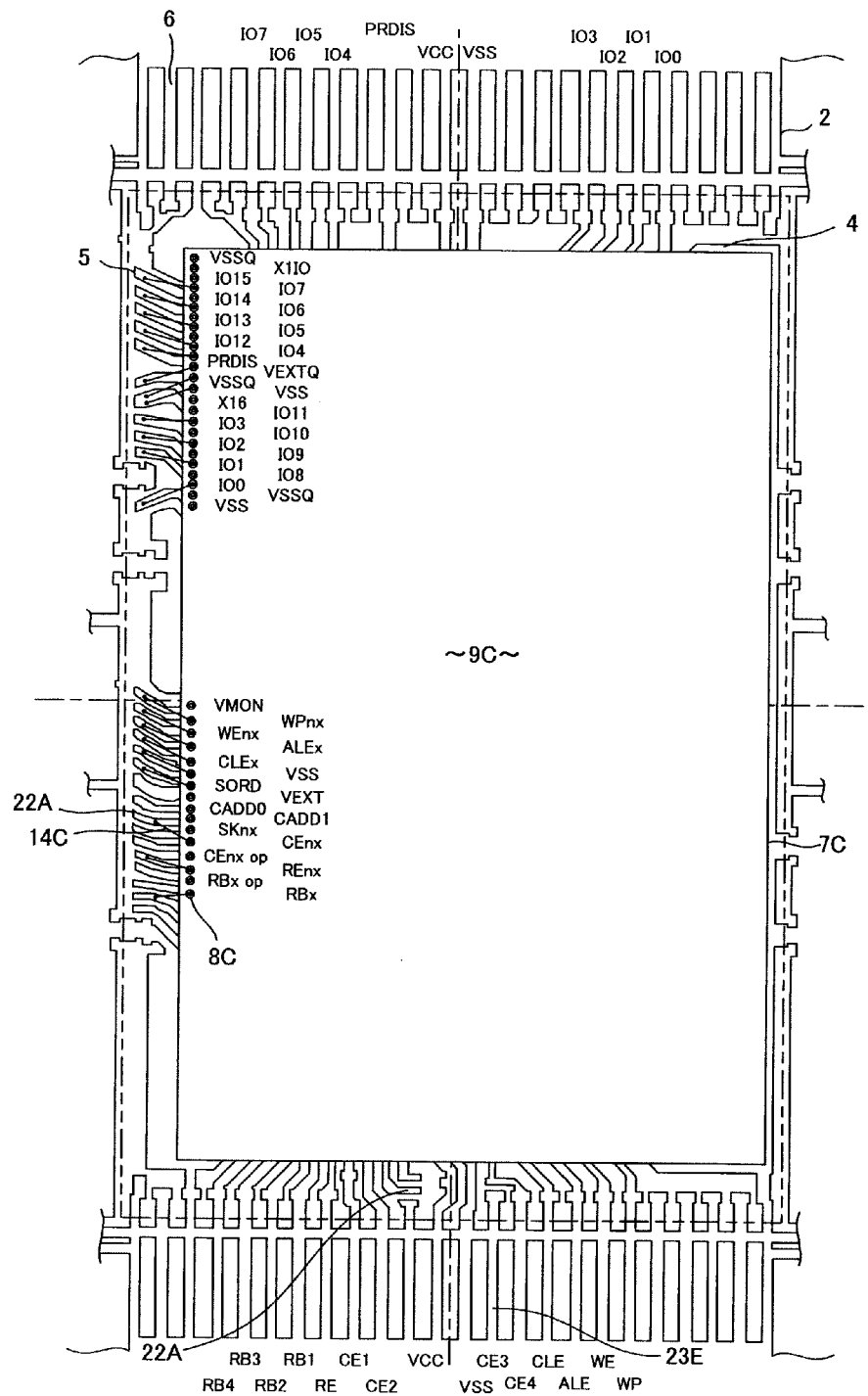
FIG. 9 is a plan view showing a state of a semiconductor element in the third tier mounted on and connected to the lead frame in the first embodiment.
Figure 10:
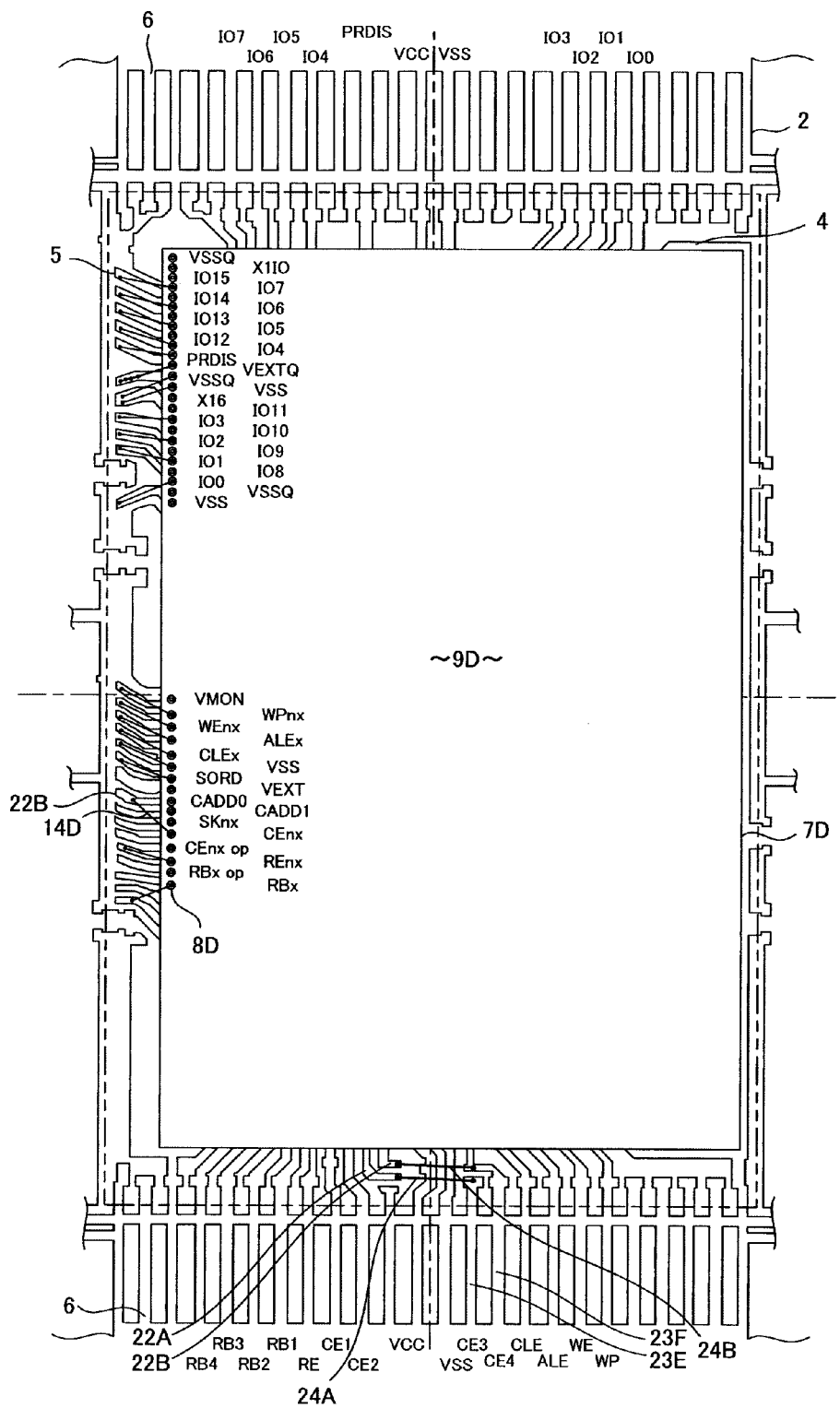
FIG. 10 is a plan view showing a state of a semiconductor element in the fourth tier mounted on and connected to the lead frame in the first embodiment.
Figure 11:
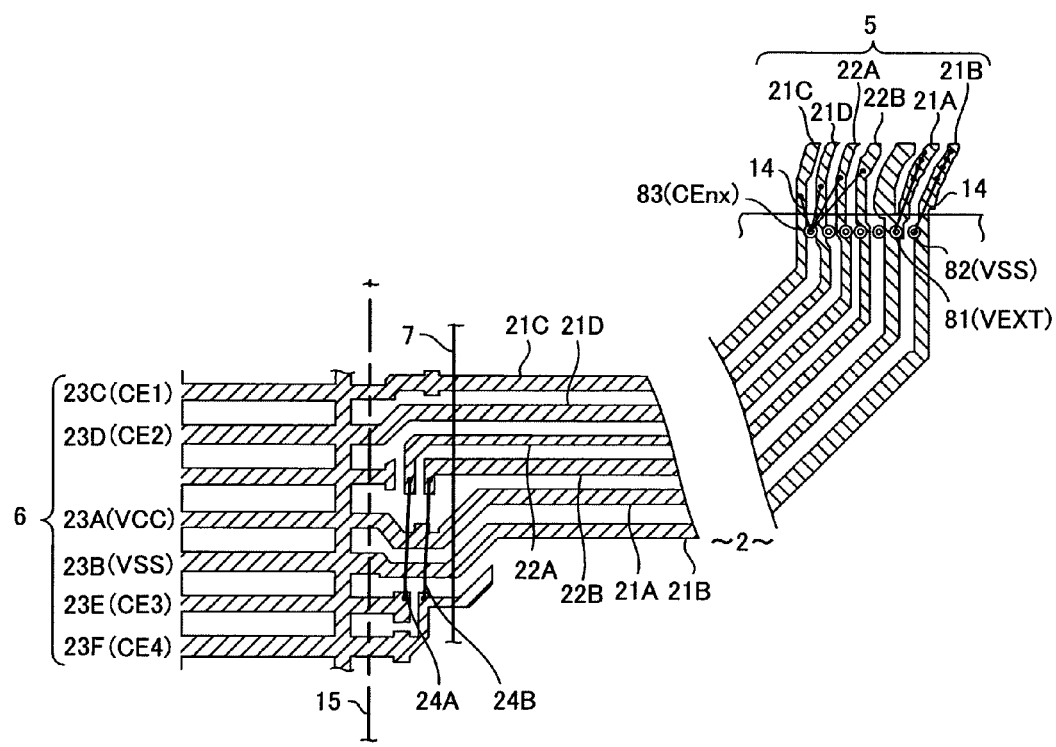
FIG. 11 is an enlarged plan view showing a connection state between the lead frame and the semiconductor elements in the respective tiers in the first embodiment.

A semiconductor device (semiconductor package) according to a first embodiment of the present invention will be described with reference to FIG. 1 to FIG. 11. FIG. 1 and FIG. 2 show the appearance of the semiconductor device according to the first embodiment. FIG. 3 is an enlarged view showing an A portion in FIG. 2. FIG. 4 shows a state of a semiconductor element mounted on a lead frame. FIG. 5 shows a configuration of the lead frame. FIG. 6 shows a connection state of metal wires to stacked semiconductor elements. FIG. 7 to FIG. 11 show the connection states between the semiconductor elements at the respective tiers and the lead frame. FIG. 11 is an enlarged view showing a connection state between an inner lead portion and an outer lead portion.

A semiconductor device 1 shown in theses drawings comprises a lead frame 2 as a circuit base for mounting elements thereon. The lead frame 2 comprises, as shown in FIG. 5, a lead portion 3 and an element support portion 4. The lead portion 3 has inner lead portions 5 that are connecting portions to semiconductor elements to be mounted on the lead frame 2, and outer lead portions 6 that are external connecting terminals, and each of the portions is composed of a plurality of leads. The outer lead portions 6 are projected outward.

The lead frame 2 has a first main surface 2a on the lower surface side and a second main surface 2b on the upper surface side. Semiconductor elements 7 are mounted on the lower surface (the first main surface) 2a side of the lead frame 2 as shown in FIG. 2, FIG. 4, and FIG. 6. FIG. 4, FIG. 5 and FIG. 7 to FIG. 11 show the lower surface 2a of the lead frame 2. FIG. 6 shows a state of the semiconductor device 1 inverted, that is, the state in which the lower surface 2a of the lead frame 2 is directed upward. The lower surface and the upper surface of the lead frame 2 are set such that on a basis of the state of the outer lead portions 6 connected to a mounting board or the like, the surface facing the front surface of the mounting board is the lower surface 2a and the surface on the opposite side to the surface facing the mounting board is the upper surface 2b.

On the lower surface 2a of the lead frame 2, as shown in FIG. 6, a first semiconductor element 7A, a second semiconductor element 7B, a third semiconductor element 7C, and a fourth semiconductor element 7D are stacked in sequence. These semiconductor elements 7A, 7B, 7C, and 7D constitute a semiconductor element group. The stack order of the semiconductor elements 7 in the semiconductor element group shows the order in which they are stacked on the lower surface 2a of the lead frame 2, which is the order from the top to the bottom when seen as the semiconductor device 1. FIG. 6 shows the inverted state of the semiconductor device 1 but the state of the forward direction as the stack direction of the semiconductor elements 7.

Concrete examples of the first to fourth semiconductor elements 7A to 7D include, for example, a semiconductor memory element such as a NAND-type flash memory. The number of the mounted semiconductor elements 7 is not limited to four. The number of the semiconductor elements 7 to be accommodated in the semiconductor device 1 may be two, three, or five or more. Further, the number of semiconductor elements 7 is not limited to plural but may be one. The semiconductor elements 7 are not limited only to the NAND-type flash memories but may be a stack of NAND-type flash memories and their controller element.

The first semiconductor element 7A has an electrode formation surface 9A formed with a first electrode pad 8A. The first semiconductor element 7A is adhered to the lower surface 2a of the lead frame 2 via a first adhesive layer 10 with the electrode formation surface 9A facing downward (in the direction in which the lower surface 2a of the lead frame 2 is directed). As will be described later, the inner lead portions 5 are routed around from the outer lead portions 6 which are disposed on short sides of the semiconductor element 7 toward a side where pad are arranged (alongside) of the semiconductor element 7, so that the first semiconductor element 7A is adhered to a portion of the inner lead portions 5 via the first adhesive layer 10 as well as to the element support portion 4.

As the first adhesive layer 10, a die attach film (an adhesive film) using a standard polyimide resin as a main component or the like is used. The thickness of the first adhesive layer 10 preferably ranges from 10 μm to 30 μm. A thickness of the first adhesive layer 10 less than 10 μm increases the capacitance between the lead frame 2 and the semiconductor element 7A. A thickness of the first adhesive layer 10 more than 30 μm increases the stack thickness of the semiconductor elements 7. Typical thicknesses of the die attach film include 10 μm, 15 μm, and 25 μm.

The second, third, and fourth semiconductor elements 7B, 7C and 7D have electrode formation surfaces 9B, 9C, and 9D formed with second, third, and fourth electrode pads 8B, 8C, and 8D, respectively. The second semiconductor element 7B is adhered to the electrode formation surface 9A of the first semiconductor element 7A via a second adhesive layer 11 with the electrode formation surface 9B facing downward. Similarly, the third and fourth semiconductor elements 7C and 7D are adhered such that the third semiconductor element 7C is adhered to the electrode formation surfaces 9B of the second semiconductor element 7B and the fourth semiconductor element 7D is adhered to the electrode formation surfaces 9C of the third semiconductor element 7C, via third and fourth adhesive layers 12 and 13, respectively, with the electrode formation surfaces 9C and 9D facing downward.

The first to fourth semiconductor elements 7A to 7D have the rectangular and the same shape and are stacked one on the other with their short sides and long sides aligned. More specifically, the first to fourth semiconductor elements 7A to 7D are stacked with their respective sides aligned so that the area occupied by the semiconductor elements 7A, 7B, 7C, and 7D (the area occupied by elements after stacked) with respect to the lead frame 2 is the smallest area (corresponding to the area of one semiconductor element 7). This suppresses an increase in package size when large-size semiconductor elements 7 are accommodated.

The electrode pads 8A to 8D of the first to fourth semiconductor elements 7A to 7D are connected to the inner lead portion 5 via first, second, third, and fourth metal wires (connecting metal wires) 14A, 14B, 14C, and 14D, respectively. For the connecting metal wire 14, a thin metal wire is used, such as a standard Au wire, Cu wire or the like.

The connecting metal wire 14 is preferably wire-bonded employing reverse bonding. For employing reverse bonding, a metal bump is formed in advance on the electrode pad 8. One end of the metal wire 14 is ball-connected to the inner lead portion 5. The other end of the metal wire 14 is connected to the metal bump formed on the electrode pad 8. This enables a reduction in loop height of the connecting metal wire 14.

Since the first to fourth semiconductor elements 7A to 7D are stacked with their respective sides aligned, the first to third metal wires 14A to 14C connected to the first to third semiconductor elements 7A to 7C can be interfered with by the semiconductor elements 7 disposed thereunder (upper side in FIG. 6) respectively, to cause a trouble such as short or the like. Hence, an end portion (an element side end portion) of the first metal wire 14A connected to the first electrode pad 8A is buried in the second adhesive layer 11 for adhering the second semiconductor element 7B located thereunder (at the upper layer in the stack order). Similarly, element side end portions of the second and third metal wires 14B and 14C are buried in the third and fourth adhesive layers 12 and 13 located thereunder (at the upper layers in the stack order), respectively.

As described above, the element side end portions of the metal wires 14A to 14C connected to the first to third semiconductor elements 7A to 7C except the fourth semiconductor element 7D at the lowermost tier (the uppermost tier in the stack order) can be buried in the adhesive layers 11, 12 and 13 located thereunder (above in the stack order), so as to prevent contact between the first metal wire 14A and the second semiconductor element 7B, contact between the second metal wire 14B and the third semiconductor element 7C, and contact between the third metal wire 14C and the fourth semiconductor element 7D. The metal wires 14 are separated from the semiconductor elements 7 based on the thicknesses of the adhesive layers 11, 12, and 13. The second to fourth adhesive layers 11, 12, and 13 also have functions as spacer layers.

The second to fourth adhesive layers 11, 12, and 13 serving as the spacer layers are made of an insulating resin capable of softening at the adhesion temperature of the semiconductor element 7 to embed the metal wire 14 therein as well as having adhesive functions. As the insulating resin, for example, a thermoplastic resin such as an acrylic resin or a thermosetting resin such as an epoxy resin can be used. The thickness of each of the adhesive layers 11, 12, and 13 preferably ranges from 30 μm to 100 μm, more preferably ranges from 50 μm to 85 μm. A thickness of each of the adhesive layers 11, 12, and 13 less than 30 μm may not to be able to suppress the contact between the metal wire 14 and the semiconductor element 7. A thickness of each of the adhesive layers 11, 12, and 13 more than 100 μm results in an excessive stack thickness of the semiconductor elements 7.

Though the thickness of each of the semiconductor elements 7A, 7B, 7C, and 7D is not always limited, the thickness of the first semiconductor element 7A to be located at the lowermost tier when performing the wire bonding is preferably made thicker than the thicknesses of the other semiconductor elements 7B, 7C, and 7D. Specifically, the thickness of the first semiconductor element 7A together with the thickness of the first adhesive layer 10 is preferably 100 μm or more in total. However, the thickness of the first semiconductor element 7A made too large only leads to an increase in stack thickness, and therefore the thickness of the first semiconductor element 7A together with the thickness of the first adhesive layer 10 is preferably made not more than 150 μm in total.

The first semiconductor element 7A having a total thickness together with the thickness of the first adhesive layer 10 less than 100 μm may make the wire bonding difficult. The thickness of the first semiconductor element 7A more preferably ranges from 80 μm to 100 μm. The bonding damage to the other semiconductor elements 7B, 7C, and 7D is reduced by the adhesive layers 11, 12, and 13 located thereunder respectively during the wire bonding. Accordingly, the semiconductor elements 7B, 7C, and 7D cannot be damaged even if their thicknesses are reduced, and it is conversely preferable to reduce their thicknesses in terms of suppression of an increase in stack thickness.

The thickness of each of the second to fourth semiconductor elements 7B to 7D is preferably less than 80 μm in order to suppress an increase in stack thickness, more preferably 70

μm or less. The lower limit of the thickness of each of the second to fourth semiconductor elements 7B, 7C, and 7D is not particularly limited, but it is preferably reduced in a range (for example, 20 μm or more) in which the semiconductor elements can be manufactured in a general manufacturing process thereof. The thickness of each of the second to fourth semiconductor elements 7B to 7D is preferably 50 μm or more in practice. It is preferable to make the thickness of the first semiconductor element 7A larger than the thickness of each of the other semiconductor elements 7B, 7C, and 7D when any thickness is selected.

The first to fourth semiconductor elements 7A to 7D stacked and mounted on the lower surface side 2a of the lead frame 2 are sealed together with the inner lead portions 5 and the first to fourth metal wires 14A to 14D by a resin sealing portion 15. For the resin sealing portion 15, a thermosetting resin is used, such as a standard epoxy resin or the like. They constitute the semiconductor device (semiconductor package) 1 in a single-surface stack structure. The semiconductor device 1 in the first embodiment is suitable for a semiconductor storage device in which semiconductor memory elements are stacked in multiple tiers to increase the capacity.

As described above, the first to fourth semiconductor elements 7A to 7D are mounted on the single surface (the lower surface 2a) of the lead frame 2. In order to accommodate the stack thickness of the semiconductor elements 7 in the thickness of the semiconductor device 1, a portion of the lead frame 2 from the element support portion 4 to the inner lead portions 5 is flattened and the flattened portion of the element support portion 4 and the inner lead portions 5 is disposed at the upper side of the resin sealing portion 15. In other words, a projecting portion of the lead frame 2 (a rim portion of the lead) from the resin sealing portion 15 is located at a position upper than normal in order to secure a space under the lead frame 2.

Specifically, as shown in FIG. 3, a thickness (an upper side resin thickness) T1 from the upper surface 2b of the lead frame 2 to the top of the resin sealing portion 15 is made small, and a thickness (a lower side resin thickness) T2 from the lower surface 2a of the lead frame 2 to the bottom of the resin sealing portion 15 is made large. Employment of such a configuration makes it possible to mount the semiconductor elements 7 in multiple tiers only on the single surface (the lower surface 2a) of the lead frame 2 without performing depress process to the lead frame 2.

For example, when the thickness of the lead frame 2 is 125 μm, the total thickness of the first semiconductor element 7A and the first adhesive layer 10 is 110 μm (the element thickness of 85 μm+the adhesive thickness of 25 μm), the thickness of each of the second to fourth semiconductor elements 7B, 7C, and 7D is 70 μm, the thickness of each of the second to fourth adhesive layers 11, 12, and 13 is 60 μm, and the thickness of the resin sealing portion 15 is 1000 μm (1 mm), the upper side resin thickness T1 of the resin sealing portion 15 is set to 185 and the lower side resin thickness T2 is set to 690 μm.

Employment of such a configuration makes it possible to mount the semiconductor elements 7 stacked in multiple tiers (the stack thickness=400 μm) only on the single surface (the lower surface 2a) of the lead frame 2 which has not been subjected to depress process. Further, the position of the projecting portion of the lead frame 2 (the rim portion of the lead) from the resin sealing portion 15 is set on the upper side to increase the height of the outer lead portions 6. This increases the spring property of the outer lead portions 6 when the semiconductor device 1 is mounted on the mother board or the like. Accordingly, the mounting reliability of the semiconductor device 1, especially, the reliability (life) to the temperature cycle can be improved.

The portion of the lead frame 2 (the element support portion 4 and the inner lead portions 5) opposing the semiconductor elements 7 is flattened. In comparison when the resin sealing portion 15 has the same size, the size of the semiconductor elements 7 mountable on the lead frame 2 can be increased as compared to the lead frame 2 which has been subjected to depress process. The size of element mountable on the lead frame 2 can be increased also by stacking the plurality of semiconductor elements 7 with their respective sides aligned. These arrangements allow semiconductor elements 7 with a larger element size to be mounted.

Next, a pad arrangement structure of the semiconductor elements 7 and the shape of the lead frame 2 will be described. The first to fourth electrode pads 8A to 8D are arranged on one side of the outline, particularly along one long side, of the respective first to fourth semiconductor elements 7A to 7D. More specifically, the first to fourth semiconductor elements 7A to 7D have a single long side pad structure as shown in FIG. 4. The outer lead portions 6 are disposed to project from both short sides of the semiconductor element 7, respectively.

The lead frame 2 needs to be configured such that the outer lead portions 6 are arranged on both short sides and the bonding portions of the inner lead portions 5 are arranged on the long side. Hence, the inner lead portions 5 are routed around from the outer lead portions 6 to connection positions to the semiconductor element 7 (positions corresponding to one of long sides of the semiconductor element 7). The inner lead portions 5 are routed around from portions connected to the outer lead portions 6 located on the short sides to the long side through bending into a direction of about 45 degrees twice to turn 90 degrees. The use of the lead frame 2 having such a shape allows the semiconductor element 7 in the single long side pad structure to be accommodated in the semiconductor device 1 having the outer lead portions 6 projecting from its both short sides.

The semiconductor element 7 in the single long side pad structure is less limited in element size and can be increased in the number of connecting electrodes as compared to the semiconductor element in a both short side pad structure or the semiconductor element in a single short side pad structure. In the both short side pad structure, the shape of the lead frame 2 can be simplified but the element size on the long side is limited. In the single short side pad structure, the number of connecting electrodes is limited as compared to the single long side pad structure. As described above, the combination of the lead frame 2 with the inner lead portions 5 routed around with the semiconductor element 7 in the single long side pad structure allows a large-size semiconductor element 7 having a large number of connecting electrodes to be mounted on the lead frame 2.

Since the inner lead portions 5 are routed around from the short side toward the long sides, their connecting portions to the semiconductor element 7 are apt to move. Hence, portions near the connecting portions of the inner lead portions 5 to the semiconductor element 7 are fixed with insulating tapes 16. The insulating tapes (lead fixing tapes) 16 are affixed to the front surface 2b side of the lead frame 2. This can increase the bonding property to the inner lead portions 5 and the handling property of the lead frame 2.

In a space created by bending the inner lead portions 5 in a direction of about 45 degrees twice, the element support portion 4 is disposed which is coupled to the two opposing sides of the lead frame 2 (opposing long sides here). This increases the supporting property of the semiconductor element 7 by the lead frame 2. Furthermore, through holes 17 are provided in the element support portion 4. This can improve the adhesiveness between the element support portion 4 and the resin sealing portion (mold resin) 15 and the wettability of the element support portion 4 to the first adhesive layer 10.

With respect to the lead frame 2, the inner lead portions 5 are routed around from the short sides toward the long side, whereby a portion of the inner lead portions 5 opposes the semiconductor element 7 mounted on the lead frame 2. If semiconductor elements are mounted on both surfaces of the lead frame 2 in such a structure, sufficient sealing resin cannot be filled in gap portions of the lead frame 2 sandwiched between the semiconductor elements. In contrast to the above, the semiconductor elements 7 are mounted only on a single surface of the lead frame 2 in this embodiment, so that sufficient sealing resin can be filled also in the gap portions of the lead frame 2. This makes it possible to provide a semiconductor device 1 with high sealing reliability.

Figure 7:
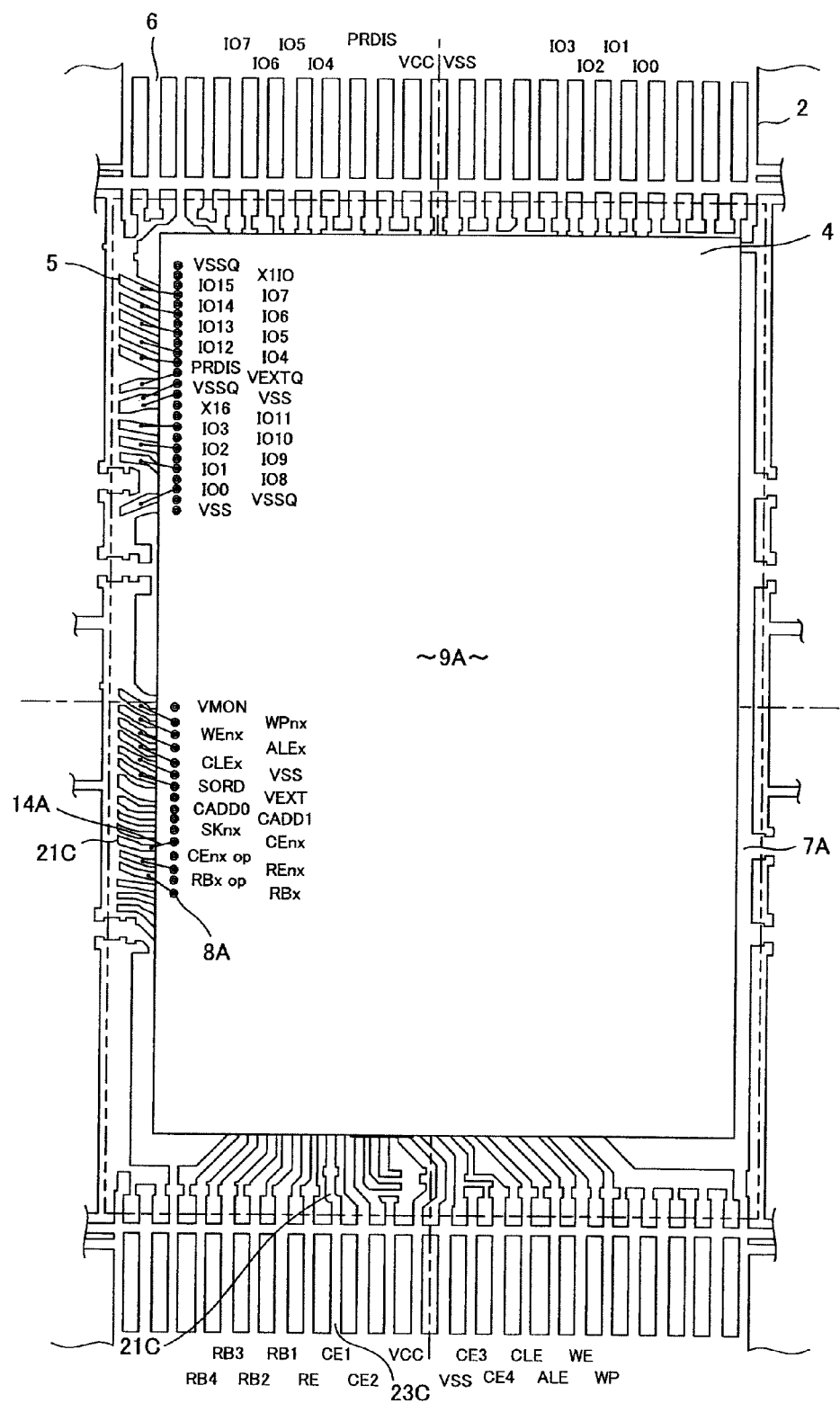
FIG. 7 is a plan view showing a state of a semiconductor element in the first tier mounted on and connected to the lead frame in the first embodiment.
Figure 8:
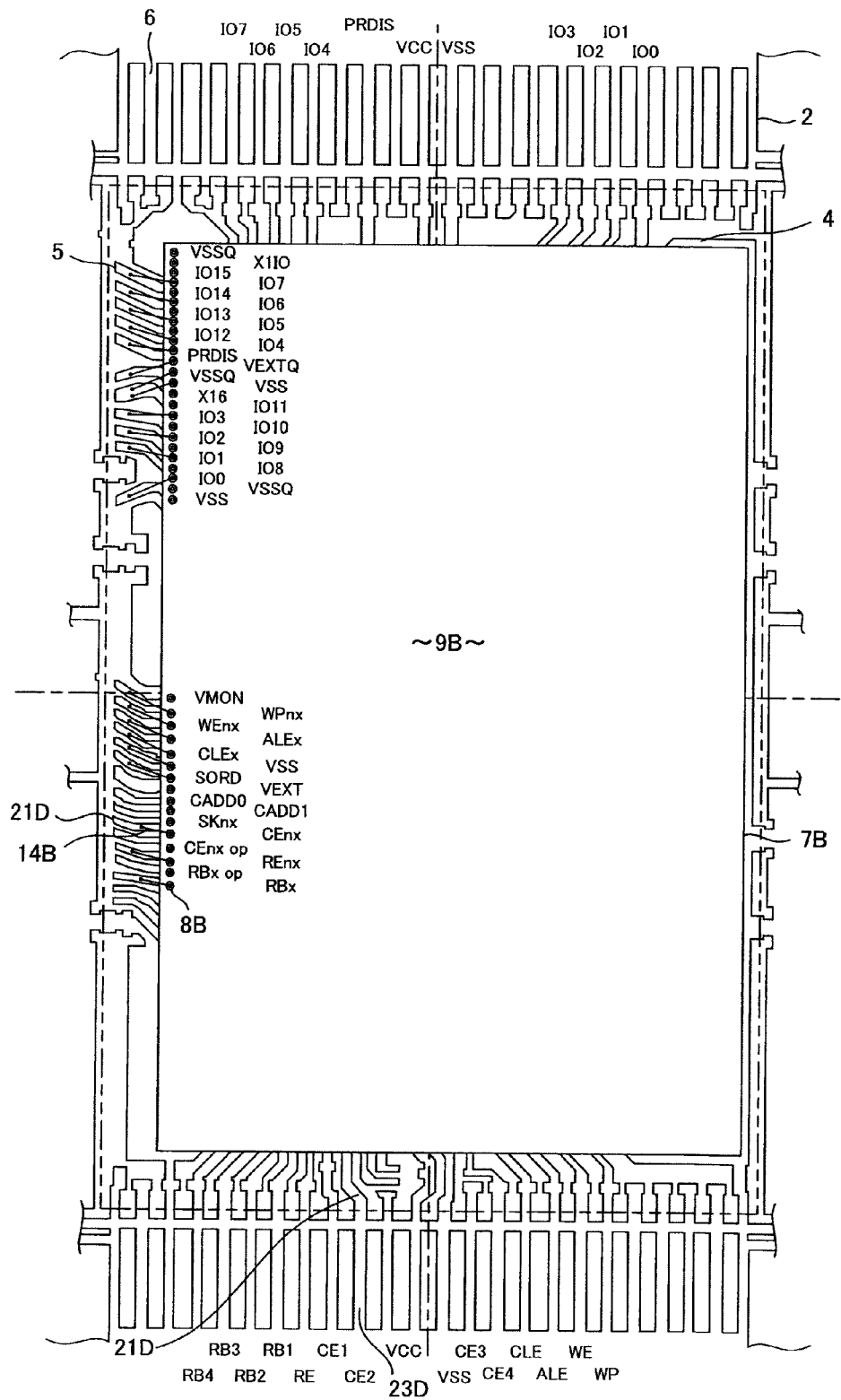
FIG. 8 is a plan view showing a state of a semiconductor element in the second tier mounted on and connected to the lead frame in the first embodiment.

Next, a concrete structure of the lead frame 2 and its connecting structure with the semiconductor elements 7A, 7B, 7C, and 7D in the respective tiers will be described. FIG. 7 shows the connection state between the first semiconductor element 7A that is the first tier in the stack order and the lead frame 2, FIG. 8 shows the connection state between the second semiconductor element 7B in the second tier and the lead frame 2, FIG. 9 shows the connection state between the third semiconductor element 7C in the third tier and the lead frame 2, and FIG. 10 shows the connection state between the fourth semiconductor element 7D in the fourth tier and the lead frame 2. FIG. 11 is an enlarged view showing an essential part of the connection state between the semiconductor elements 7 in the respective tiers and the lead frame 2. FIG. 11 shows a state of the lead frame 2 as seen through the semiconductor elements 7.

The semiconductor elements 7A, 7B, 7C, and 7D in the respective tiers have the same structure. Accordingly, the structures and arrangements of the electrode pads 8A, 8B, 8C, and 8D in the respective tiers are made the same. The electrode pads 8A, 8B, 8C, and 8D are connected to one ends of the inner lead portions 5 via the connecting metal wires 14A, 14B, 14C, and 14D, respectively. Since the inner leads and the outer leads have the same arrangement in the conventional lead frame, the arrangement of the electrode pads also corresponds to the arrangement of the outer leads and therefore their arrangement orders cannot be made different from each other. With this design, the lead frame cannot cope with various kinds of circuits.

Hence, the lead frame 2 to be applied to the semiconductor device 1 in the first embodiment has relay inner leads 22 which are not connected to the outer lead portions 6, in addition to inner leads 21 connected to the outer lead portion 6. The relay inner leads 22 are not connected to the outer lead portion 6, and are therefore in a state of electrically floating when seen in the leads only. The use of the relay inner leads 22 allows the arrangement of the electrode pads 8 to be made different from the arrangement of the outer lead portion 6. The connection state between the electrode pads 8 and the outer lead portion 6 using the relay inner leads 22 will be described with reference to FIG. 11.

As shown in FIG. 11, each of the semiconductor elements 7 has a power supply electrode pad 81 (VEXT), a ground electrode pad 82 (VSS), and a chip enable electrode pad 83 (CEnx). Each power supply electrode pad 81 is connected to a common inner lead 21A via the metal wire 14. Similarly, each ground electrode pad 82 is connected to a common inner lead 21B via the metal wire 14. The inner leads 21A and 21B are directly connected to an outer lead 23A (VCC) and an outer lead 23B (VSS). The inner leads 21A and 21B are ordinary inner leads.

The chip enable electrode pads 83 (CEnx) are connected to the individual inner leads via the metal wires 14, respectively. The chip enable electrode pad 83 in the first tier is connected to an inner lead 21C. The chip enable electrode pad 83 in the second tier is connected to an inner lead 21D. The inner leads 21C and 21D are directly connected to outer leads 23C (CE1) and 23D (CE2), respectively. The inner leads 21C and 21D are ordinary inner leads.

The chip enable electrode pads 83 in the third and fourth tiers are connected to one ends of the relay inner leads 22A and 22B, respectively. The other ends of the relay inner leads 22A and 22B are not connected to outer leads in terms of the lead structure. The relay inner leads 22A and 22B are in a state of electrically floating when seen in the leads only. The other ends of the relay inner leads 22A and 22B are electrically connected to outer leads 23E (CE3) and 23F (CE4) via relay metal wires 24A and 24B, respectively. The outer leads 23E and 23F are also in a state of electrically floating when seen in the leads structure.

Between the outer leads 23C and 23D and the outer leads 23E and 23F, the outer leads 23A and 23B are arranged. Hence, the relay metal wires 24A and 24B are arranged to step over the inner leads 21A and 21B. More specifically, the other end of the relay inner lead 22A is electrically connected to the outer lead 23E (CE3) via the relay metal wire 24A which steps over the inner leads 21A and 21B. Similarly, the other end of the relay inner lead 22B is electrically connected to the outer lead 23F (CE4) via the relay metal wire 24B which steps over the inner leads 21A and 21B. The relay metal wires 24 are wire-bonded similarly to the ordinary metal wires.

The structure in which the power supply outer leads 23A and 23B are arranged between the chip enable outer leads 23C, 23D and outer leads 23E, 23F, that is, the structure in which the arrangement order of the electrode pads 8 is made different from that of the outer leads 23 cannot be realized by the conventional lead frame. In contrast, the other ends of the relay inner leads 22A and 22B are electrically connected to the outer leads 23E and 23F via the relay metal wires 24A and 24B which are arranged to step over the inner leads 21A and 21B, whereby the arrangement order of the electrode pads 8 can be made different from that of the outer leads 23.

Thus, the use of the relay inner leads 22 and the relay metal wires 24 arranged to step over the other inner leads 21 allows the arrangement order of the electrode pads 8 to be made different from that of the outer leads 23. In other words, it becomes possible for the lead frame 2 to cope with various circuits. Further, the relay inner leads 22 are arranged similarly to the ordinary inner leads 21 to constitute the inner lead portion 5, thus making it possible for the lead frame 2 to cope with various circuits without increasing the size of the semiconductor device 1. In other words, it becomes possible to mount a large-size semiconductor element 7 on the lead frame 2 which is made to cope with various circuits without increasing the device size (package size).

Figure 12:
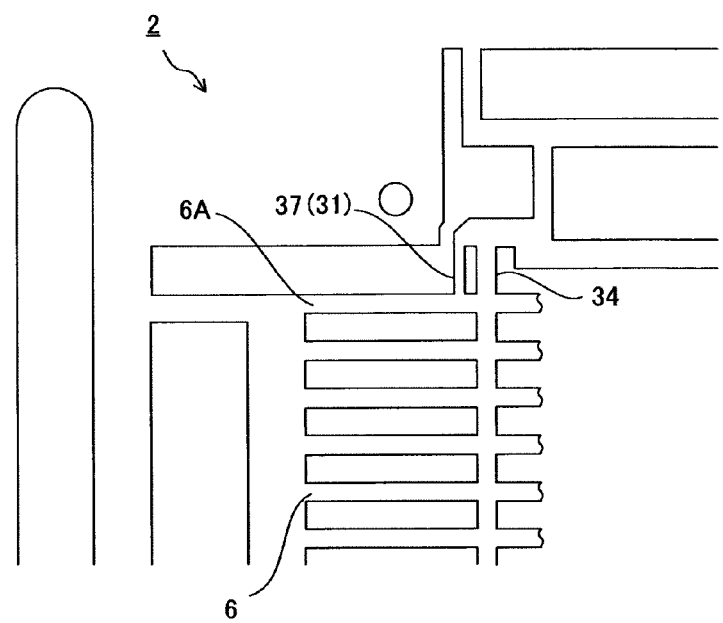
FIG. 12 is an enlarged plan view showing a portion of the lead frame having a configuration to form a positioning projection at the outer lead portion.
Figure 13:
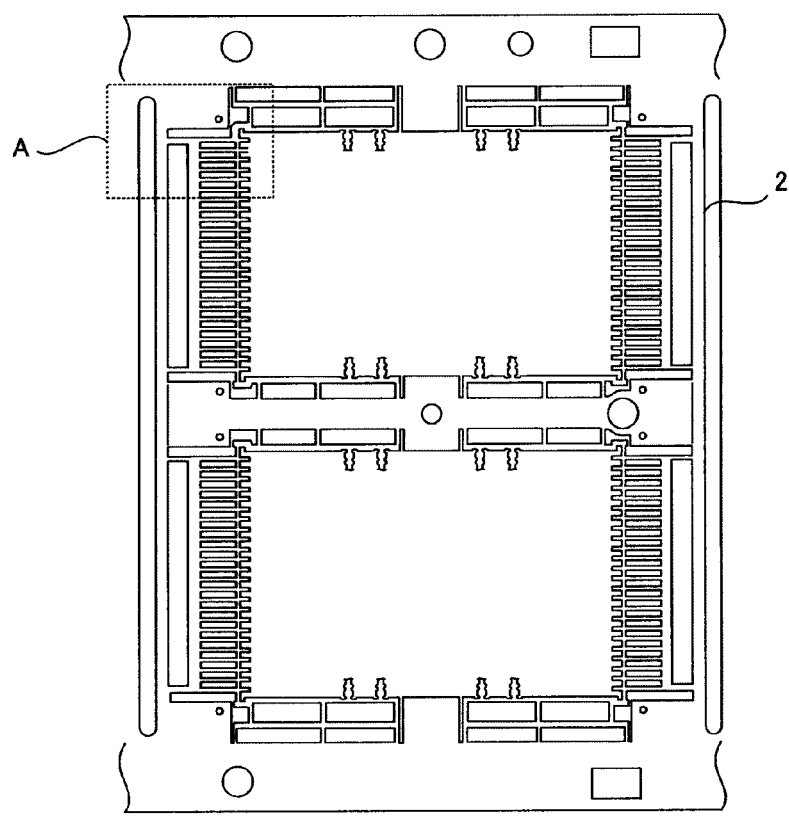
FIG. 13 is an entire view of the lead frame shown in FIG. 12.
Figure 14:
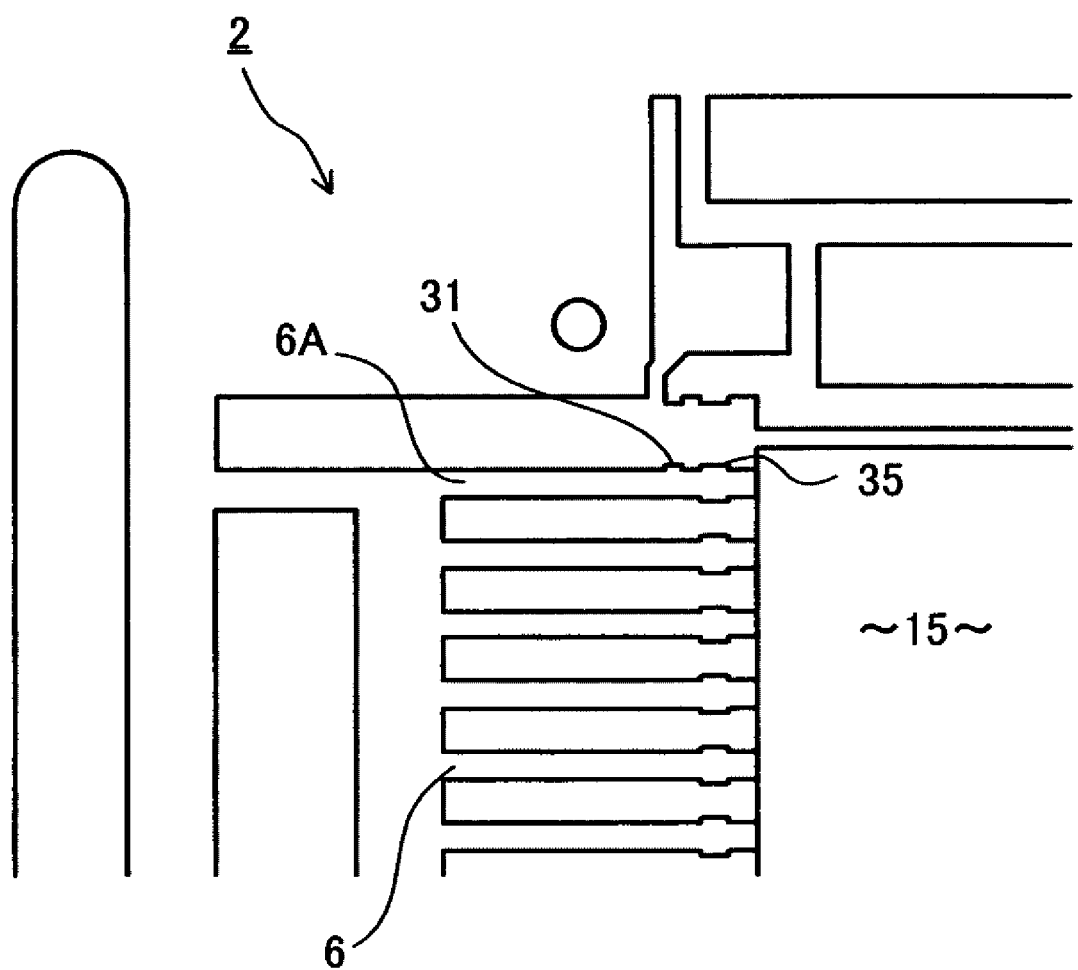
FIG. 14 is a plan view showing a state of the lead frame shown in FIG. 12 after a resin sealing process and a dambar cutting process are performed thereon.
Figure 15:
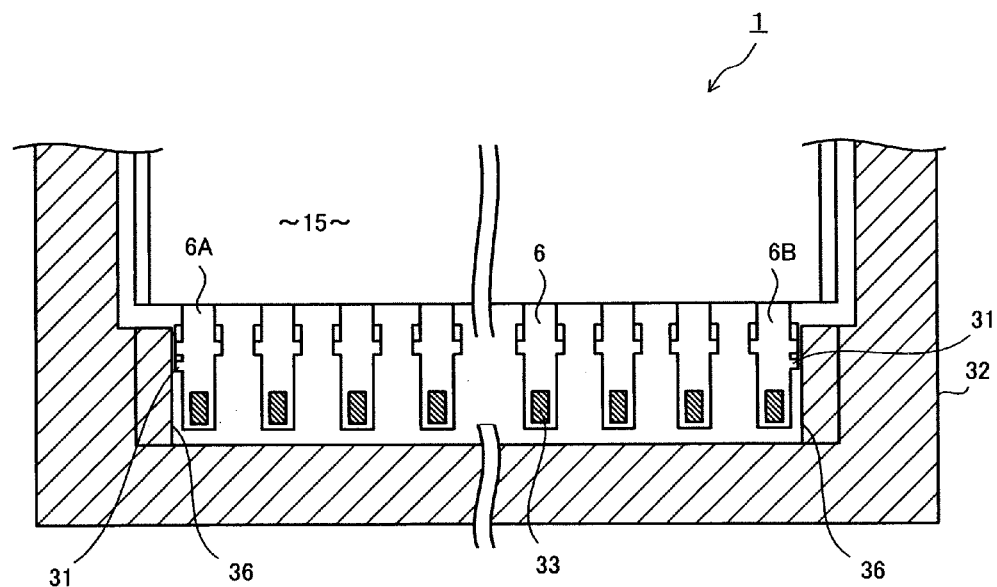
FIG. 15 is a plan view showing a state of the semiconductor device according to the embodiment of the present invention set on a test socket.
Figure 16:
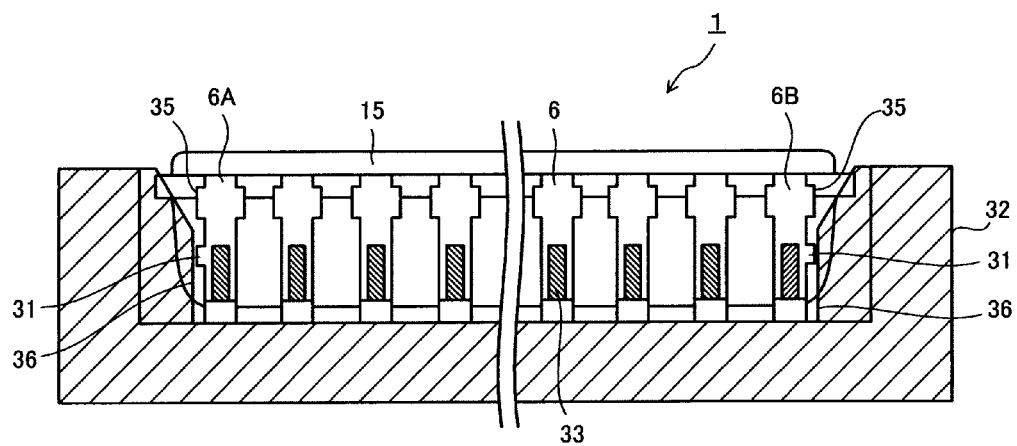
FIG. 16 is a side view of FIG. 15.

The outer lead portion 6 of the lead frame 2 has positioning projections 31 as shown FIG. 12 to FIG. 16. FIG. 12 is an enlarged view showing an A portion of the lead frame 2 shown in FIG. 13. FIG. 14 shows a state of the lead frame shown in FIG. 12 after a resin sealing process and a dambar cutting process. FIG. 15 and FIG. 16 show states of the semiconductor device 1 set on a test socket 32. Referring to these drawings, the positioning projections 31 provided on the outer lead portion 6 will be described.

Operation check of the semiconductor device 1 (TSOP or the like) using the lead frame 2 is carried out with the semiconductor device 1 set on the test socket 32. To set the semiconductor device 1 on the test socket 32, it is necessary to position the semiconductor device 1 such that electrodes 33 of the test socket 32 are brought into sure contact with the outer lead portion 6. For positioning of the outer lead portion 6 with respect to the test socket 32, portions (dambar cut portions) 35 made by cutting a dambar 34 are usually used. The dambar 34 is for damming the sealing resin in the resin sealing process (a mold process), and therefore provided at a position at about 0.2 mm from the resin sealing portion 15.

When the projecting portion of the lead frame 2 (the rim portion of the lead) from the resin sealing portion 15 is located at the position upper than usual as in the semiconductor device 1 in this embodiment, the dambar cut portions 35 can deviate from positioning surfaces 36 of the test socket 32. Hence, the positioning projections 31 are provided at the outer lead portion 6 in this embodiment. The positioning projections 31 are provided to project outward in the arrangement direction with respect to outer leads 6A and 6B respectively located on both ends in the arrangement direction of the outer lead portion 6. The positioning projections 31 are located below the dambar cut portions 35, respectively.

To the lead frame 2, as shown in FIG. 12, a rod 37 is added which will be the positioning projection 31 after dambar cutting. The rod 37 is provided outside the dambar 34. In the lead frame 2 after resin sealing, the dambar 34 is cut as shown in FIG. 14 to electrically separate the leads of the outer lead portion 6. A portion obtained by cutting away the dambar 34 remains at the outer lead portion 6 as the dambar cut portion 35. In this event, the added rod 37 is cut away together, whereby the positioning projection 31 is formed at the outer lead portion 6. The positioning projection 31 is provided at four corners of the outer lead portions 6 of the semiconductor device 1.

By using such positioning projections 31, the semiconductor device 1 in which the rim portions (the projecting portions from the resin sealing portions 15) of the lead frame 2 (the outer lead portions 6) are located at positions upper than usual can be positioned in the test socket 32 without changing the shape and structure of the test socket 32. This leads to general use of the test socket 32 and therefore contributes to a reduction in manufacturing cost of the semiconductor device 1. The positioning projection 31 is useful other than the semiconductor device 1 in this embodiment and contributes to general use of the test socket for various semiconductor devices.

The semiconductor devices are of a bed type, an LOC type, a COL type and the like depending on the mounting form of the semiconductor elements on the lead frame. The bed type means that the semiconductor element is mounted on a bed of the lead frame with its circuit surface directed upward. The LOC type means that the semiconductor element is mounted on the lower side of the inner lead with its circuit surface directed upward. The COL type means that the semiconductor element is mounted on the lower side of the inner lead with its circuit surface directed downward. Depending on the mounting forms of the semiconductor element, the resin thicknesses on the upper side and the lower side of the lead frame differ, and the positions of the outer leads drawn out from the resin sealing portions also differ.

If the semiconductor device of the LOC type or COL type is set on the test socket for the bed type, the dambar cut portion on the side surface of the outer lead is located at a higher position even if the number of pins thereof is the same as that of the bed type. Therefore, the dambar cut portion deviates from the positioning surface of the test socket for the bed type. It is impossible to test the semiconductor devices of the LOC type and COL type using the test socket for the bed type.

Even if the test socket for the bed type already exists, the test socket for the LOC type and COL type needs to be produced separately. Further, the tooling change of the test process is necessary between the bed type and the LOC type or COL type, resulting in reduced productivity. Conversely, even if the test socket for the LOC type and COL type already exists, it can also be used for the semiconductor device of the bed type, but it is not so desirable since the dambar cut portion will rub against the positioning surface of the test socket for a longer distance than usual.

In such a case, the positioning projection is formed at the outer lead in addition to the dambar cut portion, thereby making it possible to check the operation of various semiconductor devices using the same test socket. For example, when using the test socket for the bed type, the semiconductor device of the bed type is positioned at the dambar cut portion. In the semiconductor device of the LOC type and COL type, the positioning projection is brought into contact with the positioning surface of the test socket, so that the semiconductor device is correctly positioned on the test socket for the bed type. These arrangements allow the quality check test of various semiconductor devices to be carried out.

Figure 17:
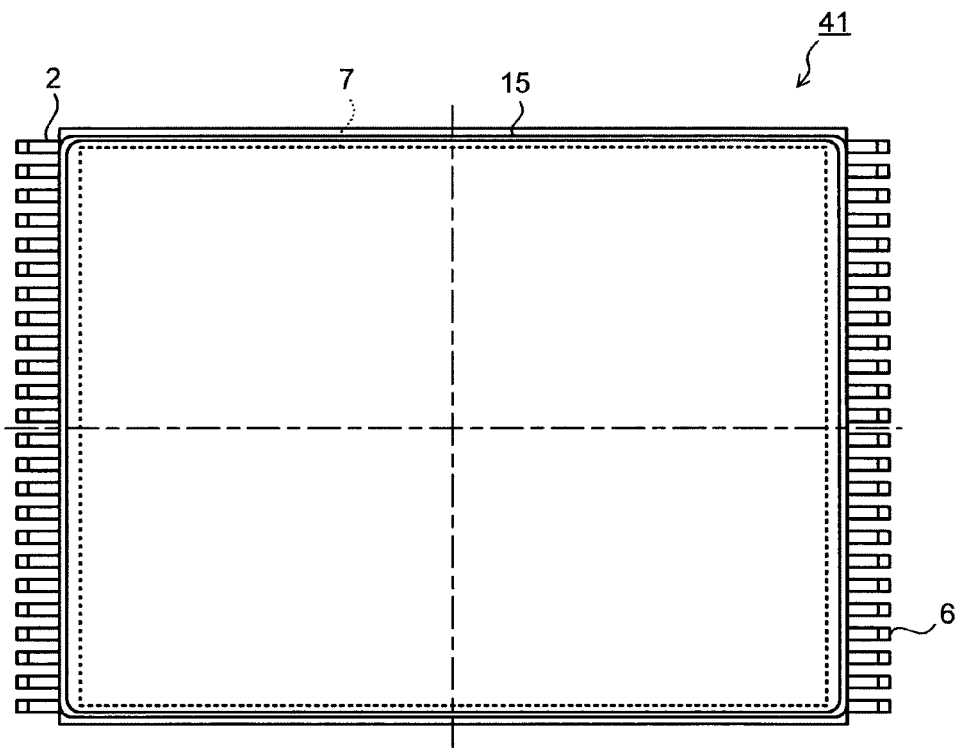
FIG. 17 is a plan view showing a semiconductor device according to a second embodiment of the present invention.
Figure 18:
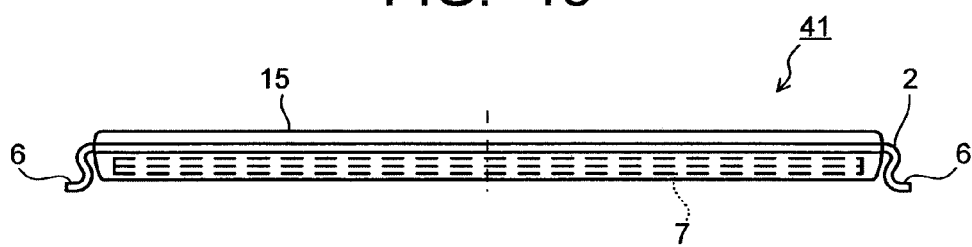
FIG. 18 is a front view of the semiconductor device shown in FIG. 17.
Figure 19:
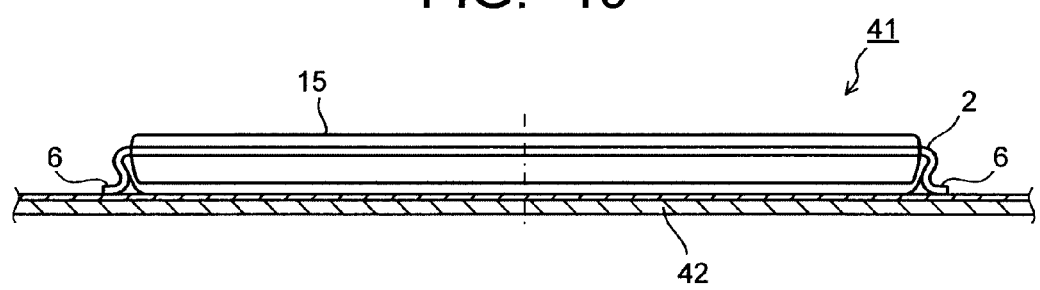
FIG. 19 is a front view showing a state of the semiconductor device according to the second embodiment mounted on a mounting board.
Figure 20:
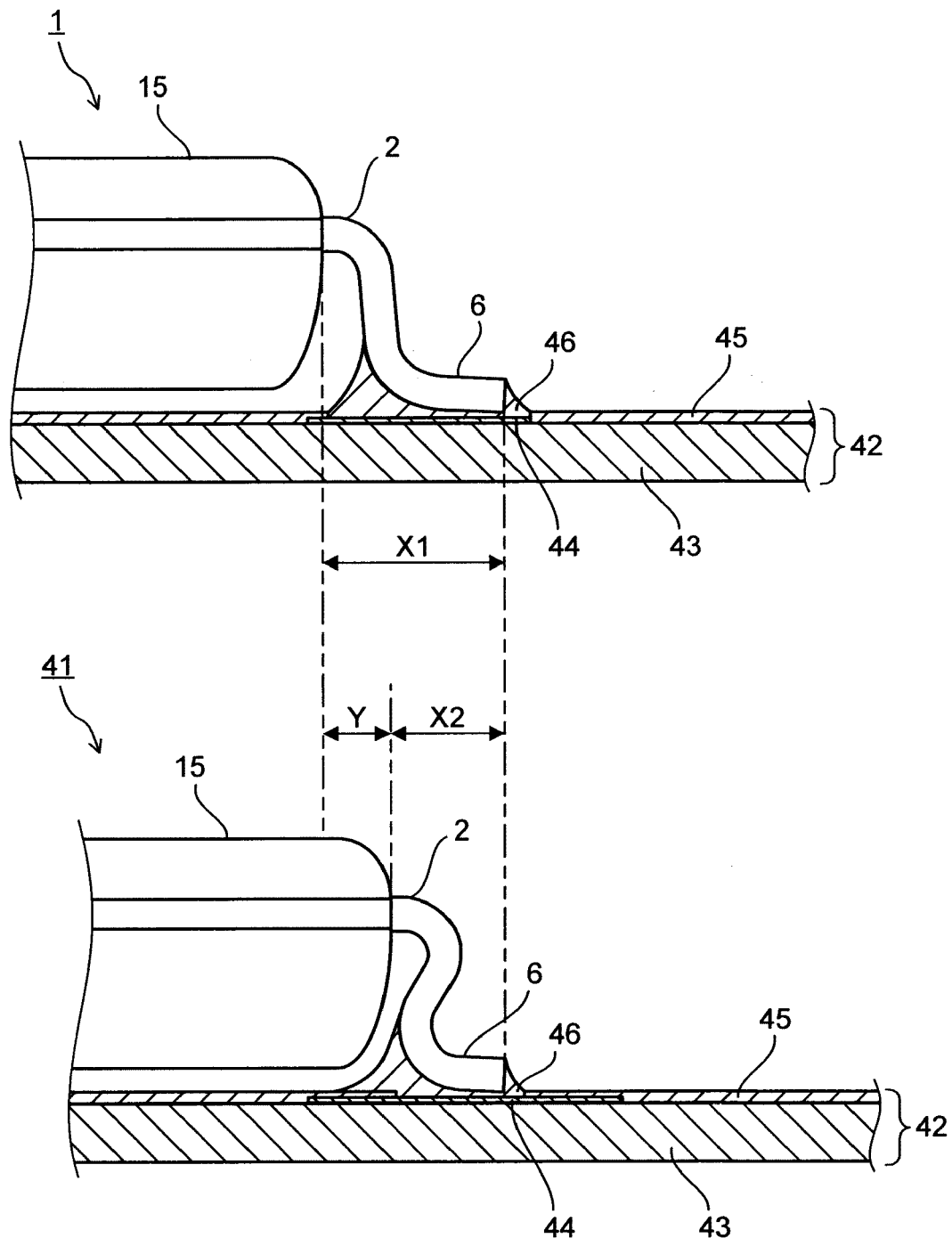
FIG. 20 is an enlarged view showing a portion in FIG. 19.

Next, a semiconductor device (semiconductor package) according to a second embodiment of the present invention will be described with reference to FIG. 17 to FIG. 20. FIG. 17 and FIG. 18 show the appearance of the semiconductor device according to the second embodiment. FIG. 19 shows a state of the semiconductor device according to the second embodiment mounted on a mounting board. FIG. 20 is an enlarged view showing a portion in FIG. 19. FIG. 20 is a view of the semiconductor device (lower view) according to the second embodiment compared in shape to the semiconductor device (upper view) according to the first embodiment. Note that the same numerals are given to the same portions as those in the first embodiment and description thereof will be partially omitted.

A semiconductor device 41 shown in FIG. 17 to FIG. 20 comprises a lead frame 2. The lead frame 2 has inner lead portions (not shown) and outer lead portions 6 as in the first embodiment. On a lower surface 2a of the lead frame 2, a plurality of semiconductor elements 7 are stacked. Note that the number of semiconductor elements 7 to be mounted on the lead frame 2 is not limited to plural. One semiconductor element 7 may be mounted on the lead frame 2.

The shape of the lead frame 2, the shape of the semiconductor element 7 (the arrangement form of electrode pads and the like), the number of semiconductor elements 7 mounted on the lead frame 2, the connection structure between the lead frame 2 and the semiconductor elements 7 (connection via metal wires) and so on are the same as those in the first embodiment. The semiconductor device 41 in the second embodiment has the same configuration as the semiconductor device 1 in the first embodiment except for the shape of outer lead portions 6 described below.

In the semiconductor device 41 in the second embodiment, the outer lead portions 6 project from both ends of a resin sealing portion 15 accommodating the semiconductor element 7. Portions of the outer lead portions 6 projecting from the resin sealing portion 15 serve as support portions of the resin sealing portion 15 in addition to the function as external connecting terminals. The projecting portions of the outer lead portions 6 are shaped to support the resin sealing portion 15. Further, the projecting portions of the outer lead portions 6 have an S-shape when the projecting direction of the outer lead portions 6 is seen from a lateral view (when seen in the front direction).

The semiconductor device 41 is made such that its full width (the distance between tips of the outer lead portions 6 projecting from both ends of the resin sealing portion 15) is the same as that of the semiconductor device 1 in the first embodiment. The full width of the semiconductor devices 1 and 41 is adjusted to the full width of a typical TSOP. The semiconductor device 41 is mounted on a mounting board 42 as shown in FIG. 19 and FIG. 20. The mounting board 42 is composed of a printed circuit board or the like. The mounting board 42 has a base material 43, a copper foil portion 44 formed on its surface, and a solder resist 45 applied on the copper foil portion 44 so as to expose a part of it. To the copper foil portion 44, the outer lead portion 6 is soldered. A numeral 46 denotes a solder.

The semiconductor device 41 of the second embodiment can be mounted on the same mounting board (the printed circuit board) 42 as that of the semiconductor device 1 in the first embodiment without changing the position of the copper foil portion 44 and the like, because the tip position of the outer lead portion 6 is the same as that in the first embodiment. Further, since the semiconductor device 41 has the S-shaped outer lead portion 6, the width (corresponding to a width X2 in FIG. 20) occupied by the outer lead portion 6 is smaller than the width (corresponding to a width X1 in FIG. 20) occupied by the outer lead portion 6 of the semiconductor device 1 in the first embodiment.

Accordingly, the width (corresponding to a width Y in FIG. 20) of the resin sealing portion 15 can be increased by the amount of the reduction in the occupied width X2 by the outer lead portion 6. This allows a large-size semiconductor device 7 to be mounted on the semiconductor device 41 having the same full width. The semiconductor device 41 in the second embodiment has a width of the resin sealing portion 15 larger, for example, by about 0.6 mm than that of the semiconductor device 1 in the first embodiment. A semiconductor element 7 larger according to that amount can be mounted.

With the semiconductor device 41 of the second embodiment, a large-size semiconductor element can be mounted on the lead frame 2 while employing the mounting board 42 that is similar to that in the first embodiment, that is, the mounting board (the printed circuit board) 42 having standard dimensions. The size of the semiconductor element 7 mounted on the lead frame 2 can be increased to provide the semiconductor device 41 which can cope with the semiconductor elements 7 in various shapes. For example, the element shape of the semiconductor memory element is increased in size in order to increase the capacity. The semiconductor device 41 is applicable to the semiconductor memory element having an increased element shape and is effective as a package structure.

The manufacturing cost of the semiconductor device 41 just increases in material cost of a mold resin forming the resin sealing portion 15, and therefore stays about the same as that of the first embodiment. In short, the characteristics of an inexpensive TSOP are never lost. As the package structure on which a large-size semiconductor element is mounted, a BGA package is known but is expensive. By applying the semiconductor device 41 of this embodiment, a large-size semiconductor 7 can be mounted on the inexpensive semiconductor package (TSOP). Accordingly, the semiconductor package on which a large-size semiconductor element 7 is mounted can be provided without losing the characteristics of the inexpensive TSOP.

Figure 21A:
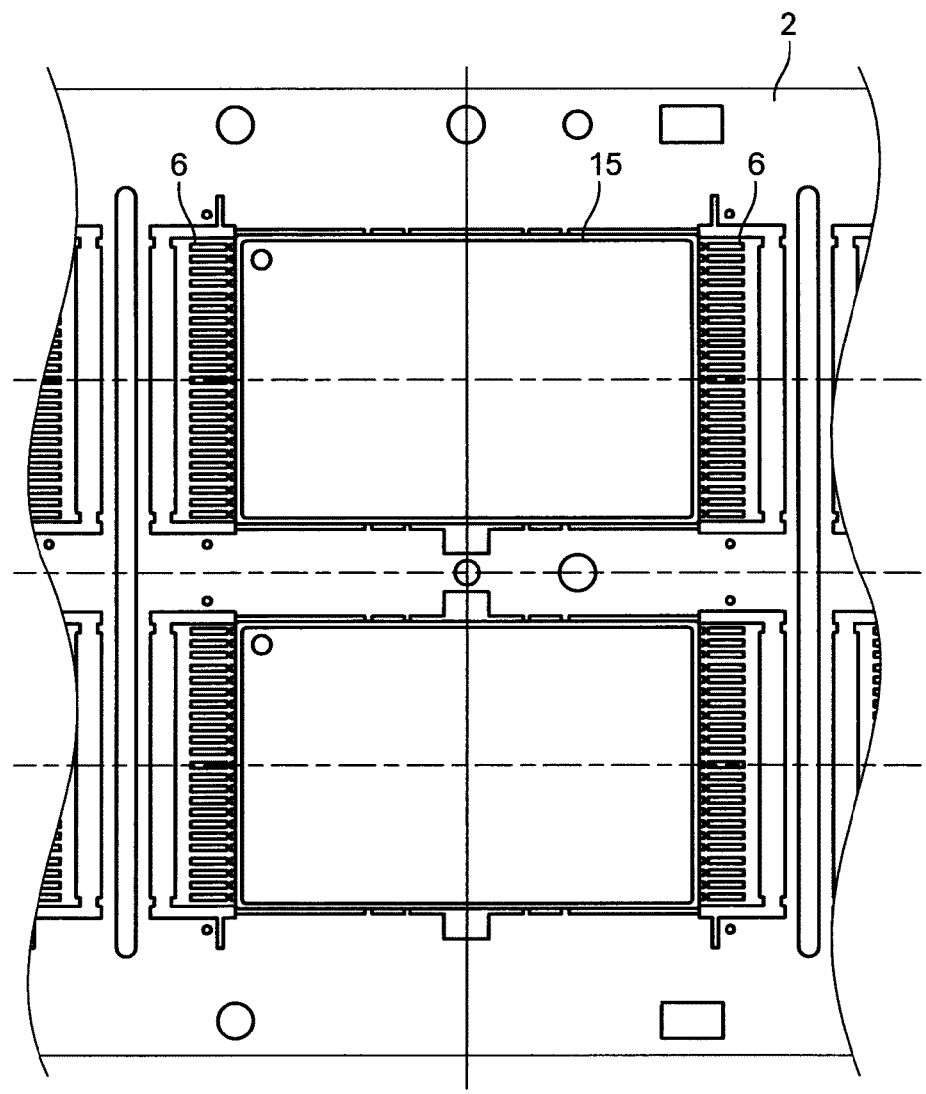
FIG. 21A to FIG. 21D are plan view showing a manufacturing process of the semiconductor device according to the second embodiment.
Figure 21B:
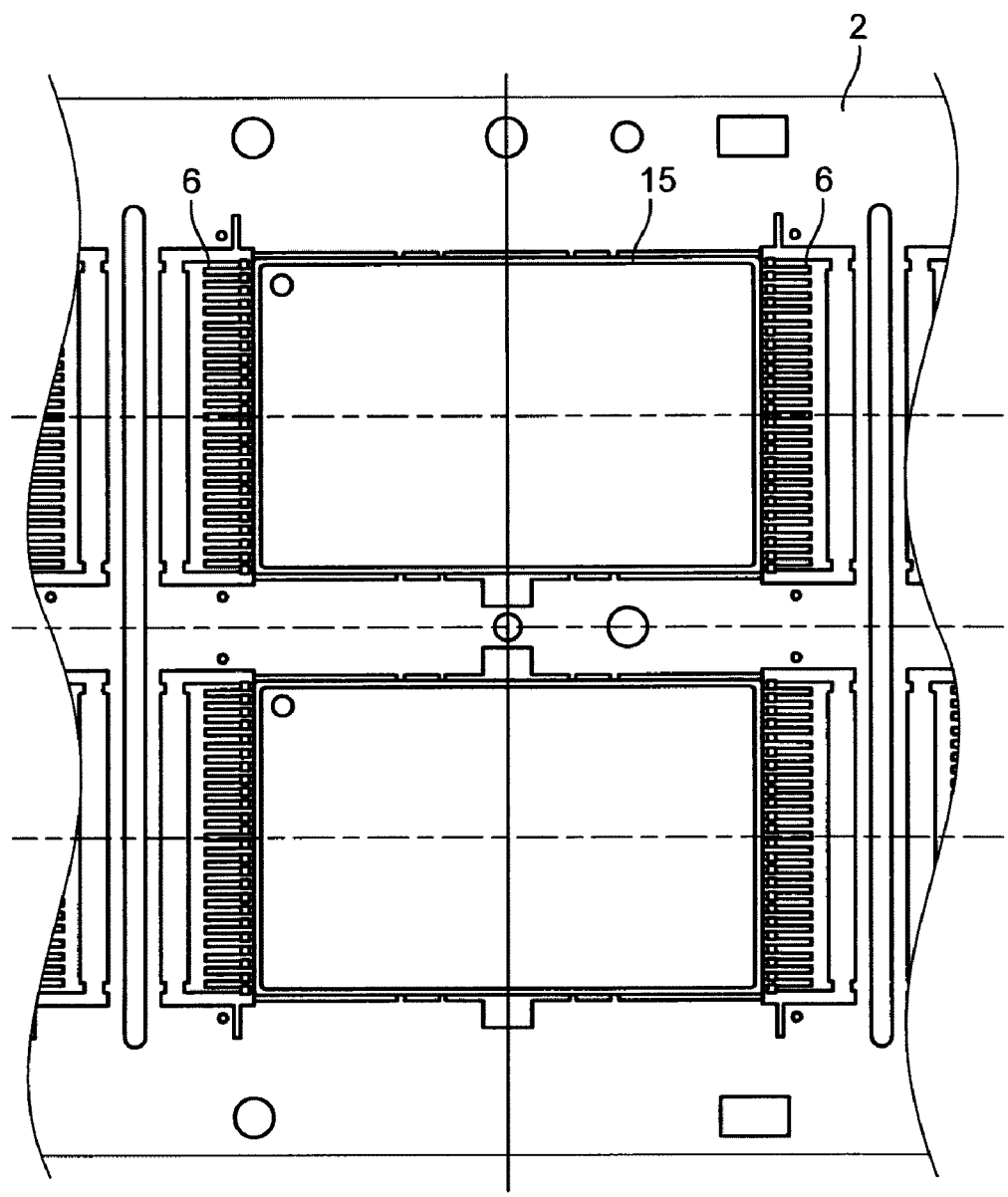

A manufacturing process of the semiconductor device (semiconductor package) 41 having the S-shaped outer lead 6 will be described with reference to FIGS. 21A to 21D and FIGS. 22A to 22D. First, as shown in FIG. 21A and FIG. 22A, a plurality of semiconductor elements 7 mounted on the lead frame 2 are sealed with the resin sealing portion 15, and then connecting portions of the outer leads 6 to dambars and an outer frame are cut to make the outer leads 6 free. Subsequently, as shown in FIG. 21B and FIG. 22B, portions of the outer leads 6 projecting from the resin sealing portion 15 are bent into a gull wing shape. In this event, the tips of the outer leads 6 are coupled to each other to prevent the outer leads 6 from separating from each other by the bending process.

Figure 21C:
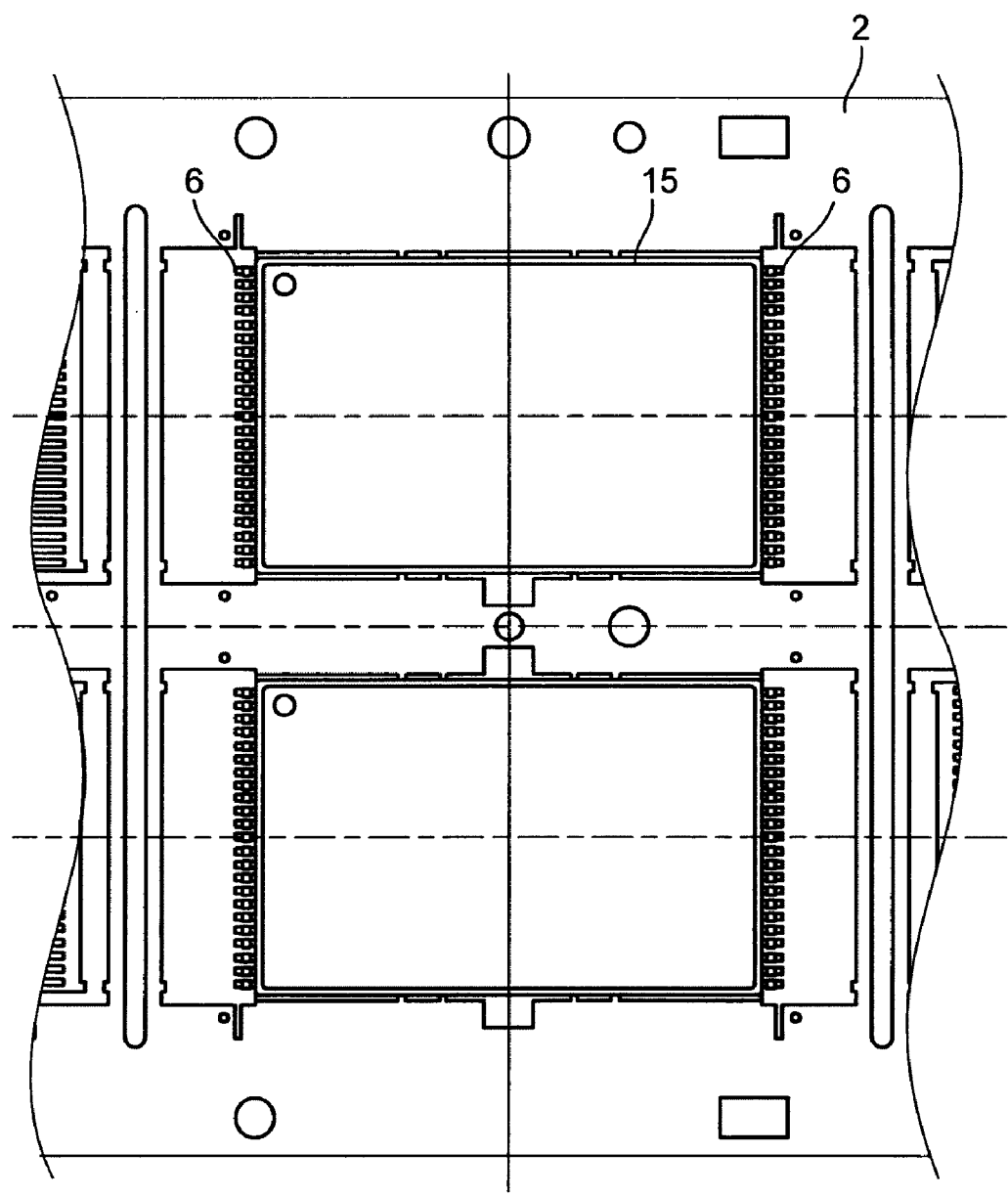
Figure 21D:
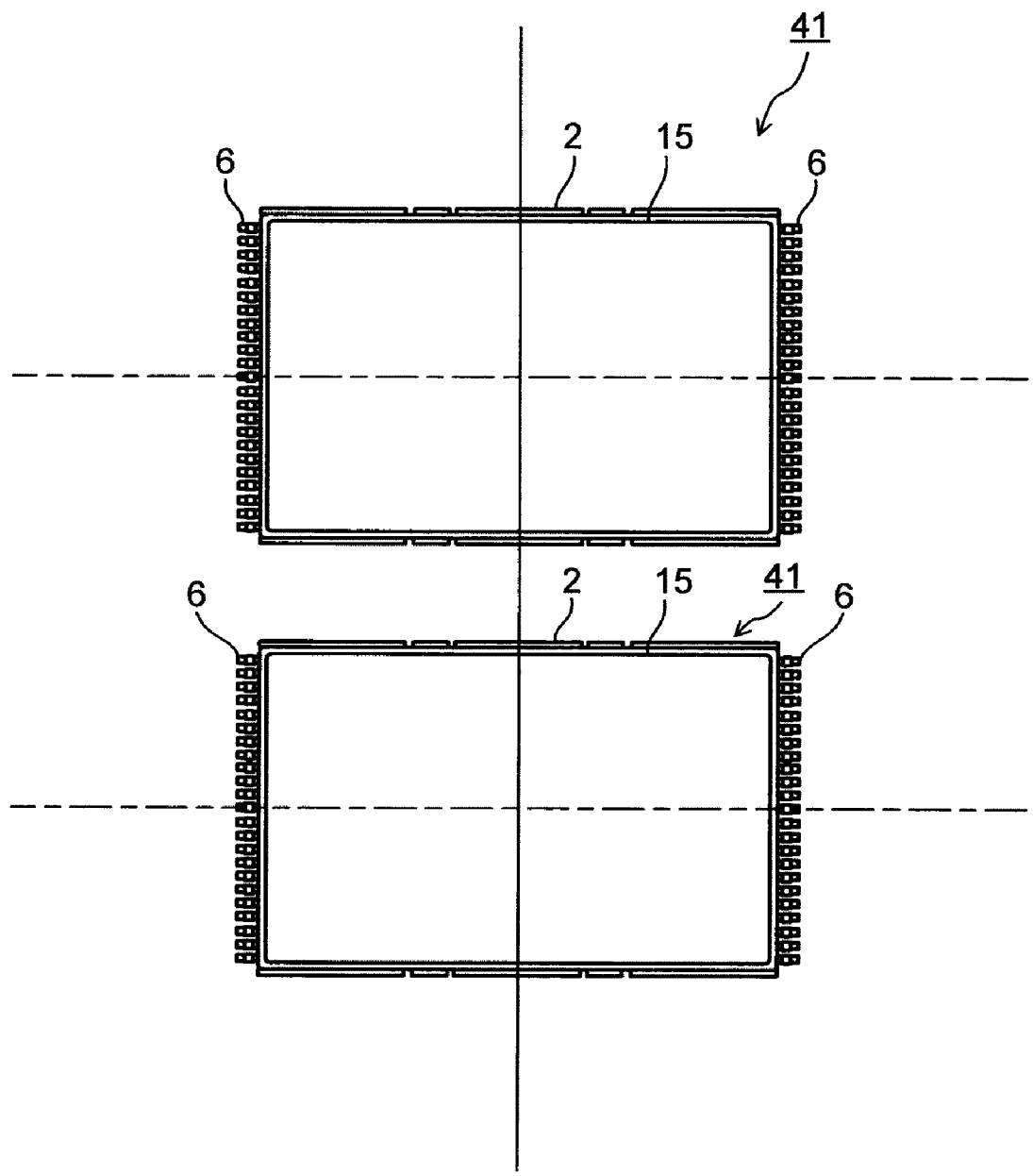
Figure 22A:
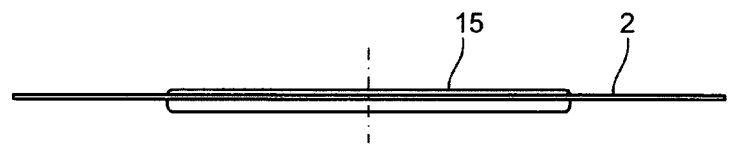
FIG. 22A to FIG. 22D are sectional views of FIG. 21A to FIG. 21D.
Figure 22B:
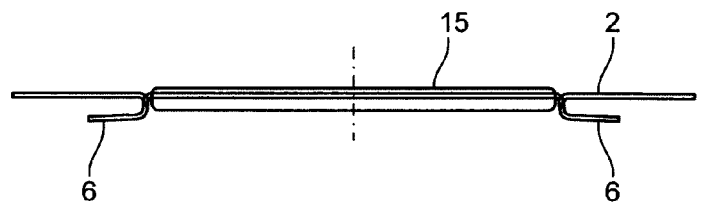
Figure 22C:
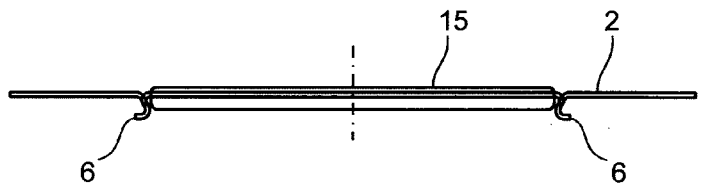
Figure 22D:
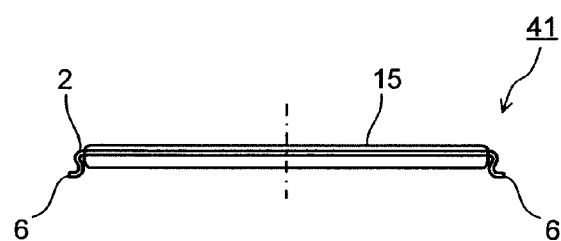

Next, as shown in FIG. 21C and FIG. 22C, the tips of the outer leads 6 are cut at a position where the developed length of the outer leads 6 is equal to the developed length after bending into the S-shape, and the outer leads 6 are then bent into the S-shape. Thereafter, as shown in FIG. 21D and FIG. 22D, supporting pins of the lead frame 2 are cut to separate the semiconductor device (semiconductor package (TSOP)) 41 from the outer frame of the lead frame 2. Thus, the semiconductor device (semiconductor package) 41 having the outer leads 6 in the S-shape is obtained.

Figure 23A:
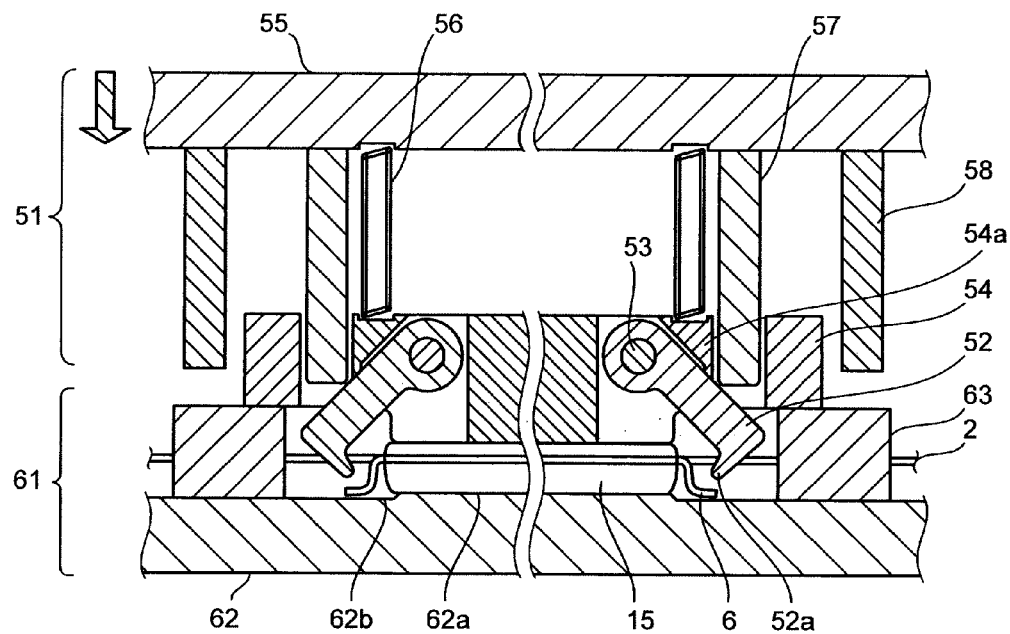
FIG. 23A and FIG. 23B are views showing a working process of the outer leads into an S-shape.
Figure 23B:
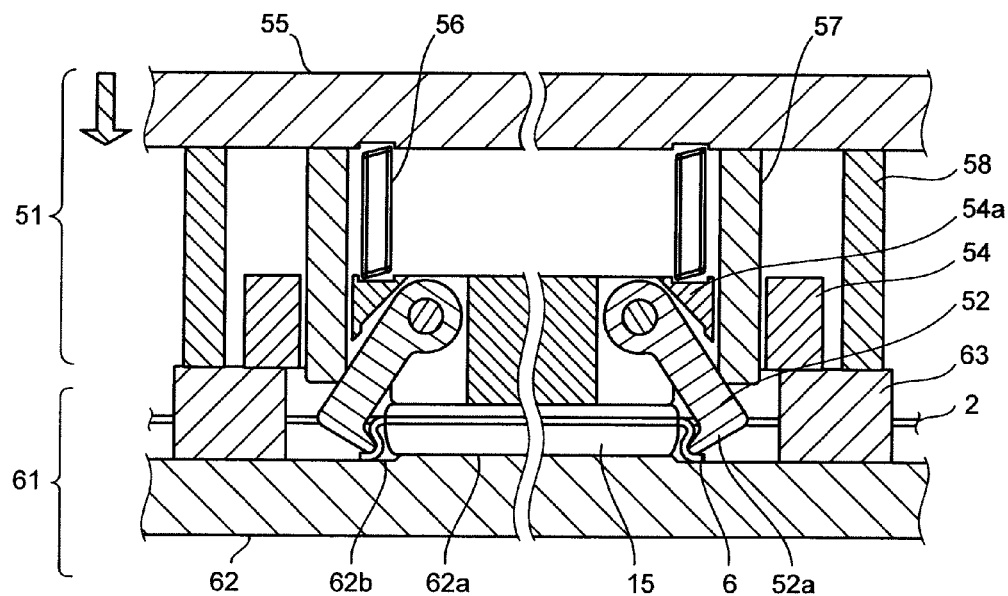
Figure 24:
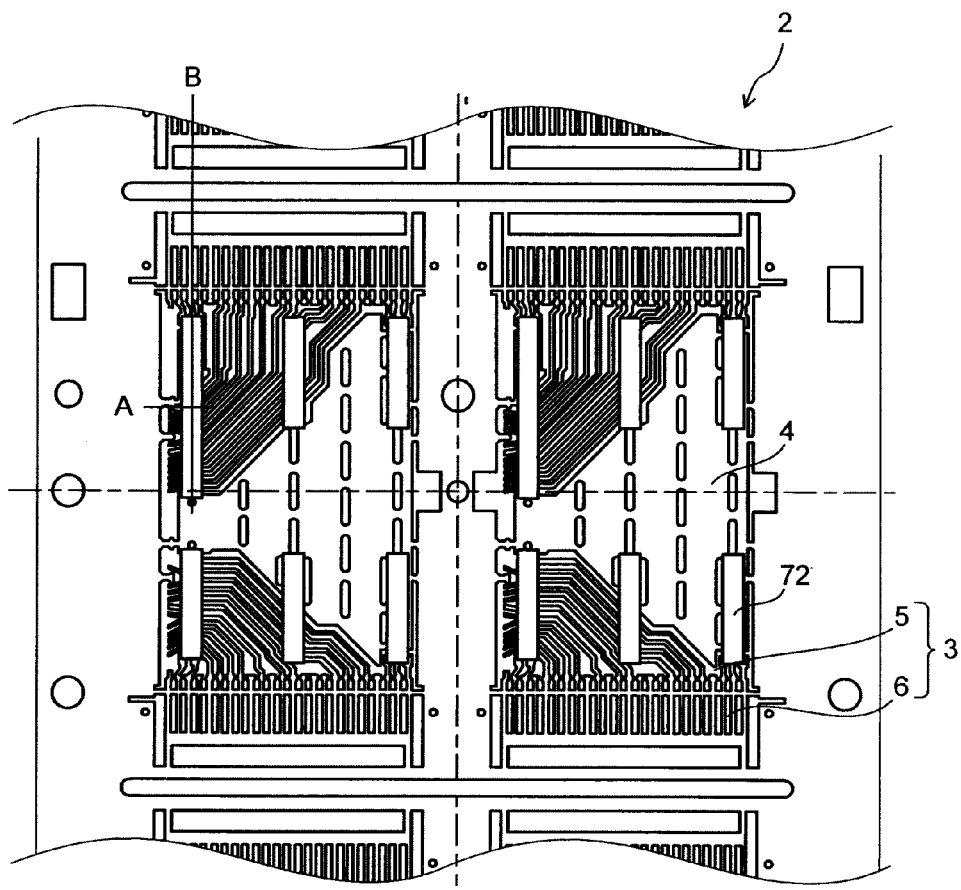
FIG. 24 is a plan view showing a lead frame for use in a semiconductor device according to a third embodiment.
Figure 25:
FIG. 25 is a side view of the lead frame shown in FIG. 24.

FIGS. 23A and 23B show a die for trimming and forming and a process of bending the outer lead 6 into the S-shape using the die. An upper die 51 of the trimming and forming die comprises levers 52 having first working points 52a for bending the outer lead 6, and first plate 54 to which the levers 52 are attached with pins 53 in a rotatable state. The levers 52 are usually opened to the outside with respect to each other by springs (not shown). Further, the levers 52 are configured not open to the outside more than about 45° by stopper portions 54a provided on the respective first plate 54.

The first plate 54 is attached to a second plate 55 in a manner to be vertically slidable. Between the first and second plates 54 and 55, springs 56 are attached to usually press the first plate 54 downward. The first plate 54 is configured not to be lowered from the state in the drawings relative to the second plate 55 by a stopper (not shown) attached to the second plate 55. To the second plate 55, punches 57 are attached for pushing the levers 52 to rotate them inward. The second plate 55 has first stoppers 58 to prevent the upper die 51 from lowering from a prescribed position.

A lower die 61 for trimming and forming comprises a third plate 62 having a protruded flat surface 62a for supporting the resin sealing portion 15 and second working points 62b for shaping the outer leads 6 into the S-shape in combination with the levers 52. To the third plate 62, second stoppers 63 are attached. The first stoppers 58 attached to the second plate 55 butt against the second stoppers 63 to prevent themselves from moving down more than setting. The first and second stoppers 58 and 63 are attached to positions other than the lead frame 2 so as not to interfere with carriage of the lead frame 2.

The semiconductor package in which the outer leads 6 are bent into the S-shape is carried together with the lead frame 2 to a position for S-shape bending and set on the protruded flat surface 62a which supports the resin sealing portion 15. Subsequently, as shown in FIG. 23A, when the upper die 51 is lowered, the first plate 54 is bought into contact with the second stoppers 63 of the lower die 61. The setting in this event is made such that a slight gap remains between the first plate 54 and the resin sealing portion 15 to prevent the semiconductor package from floating and the resin sealing portion 15 from being scratched during processing of the outer leads 6.

The lower die 51 is further lowered to bring the punches 57 into contact with the levers 52 to thereby rotate the levers 52 inward. The working points 52a of the levers 52 butt against the outer leads 6 to first bring the outer leads 6 into contact with the second working points 62b of the third plate 62. As shown in FIG. 23B, the levers 52 further rotate inward to push the outer leads 6 inward so that the tips of the outer leads 6 slide over the second working points 62b, thereby bending the outer leads 6 into the S-shape. When the first stoppers 58 of the upper die 51 butt against the second stoppers 63 of the lower die 61, the upper die 51 stops lowering to stop rotation of the levers 52 as well. This completes shaping of the outer leads 6 into the S-shape.

Thereafter, the upper die 51 starts rising, and the punches 57 thereby rise to open the levers 52 up to positions where the levers 52 butt against the stopper portions 54a of the first plate 54. When the upper die 51 is rising, the levers 52 never butt against the outer leads 6. The upper die 51 further rises and stops at the upper limit position. This secures a space when the S-shape formed semiconductor package is carried to the next supporting pin cutting process. The S-shape formed semiconductor package is carried together with the lead frame 2 to the supporting pin cutting position and then separated from the lead frame 2, thereby completing the semiconductor package (semiconductor device) 41 of this embodiment.

The outer lead 6 having the S-shape is not limited to the semiconductor device (semiconductor package) having the same structure as that of the first embodiment, but is applicable to a semiconductor device (semiconductor package) comprising a plurality of semiconductor elements stacked on the lower surface side of the lead frame. In this case, it is preferable that the semiconductor element has electrode pads arranged along one of long sides and the outer leads of the lead frame are arranged to project from both short sides of the semiconductor element. Further, the inner leads are preferably routed around from the outer leads toward the long side where the electrode pads are arranged. Its concrete configuration is as has been described above.

Further, to reduce the area occupied by the plurality of semiconductor elements with respect to the resin sealing portion, it is preferable that the plurality of semiconductor elements have the same shape and are stacked one on the other with their respective sides aligned. In this case, the end portions of the metal wires connected to the semiconductor element on the lower layer side in the stack order with respect to the lead frame are preferably buried in the adhesive layer which adheres the semiconductor element on the upper layer side in the stack order. These configurations applied in combination enable realization of the semiconductor device (semiconductor package) comprising a larger semiconductor element having a larger number of electrodes.

Note that the present invention is not limited to the above-described embodiments, but is applicable to various semiconductor devices in which one or more semiconductor elements are stacked and mounted on a single surface of the lead frame. Such semiconductor devices are included in the present invention. The embodiments of the present invention can be extended or changed within the technical scope of the present invention, and the extended and changed embodiments are also included in the technical scope of the present invention.

Next, a semiconductor device (semiconductor package) according to a third embodiment of the present invention will be described with reference to FIG. 24 to FIG. 31. FIG. 24 to FIG. 27 show a lead frame for use in the semiconductor device according to the third embodiment. FIG. 28 to FIG. 31 show the semiconductor device according to the third embodiment. Note that the same numerals are given to the same portions as those in the first and second embodiments and description thereof will be partially omitted.

A semiconductor device 71 shown in FIG. 28 to FIG. 31 comprises a lead frame 2 shown in FIG. 24 to FIG. 27. The lead frame 2 comprises a lead portion 3 and an element support portion 4 as in the above-described embodiments. The lead portion 3 has inner leads 5 that will be connecting portions to the semiconductor element to be mounted on the lead frame 2, and outer leads 6 that will be external connecting terminals. The outer leads 6 are arranged on both short sides.

The inner leads 5 have the connecting portions to the outer leads 6 arranged on both short sides and the connecting portions to the semiconductor element arranged on one long side. Accordingly, the inner leads 5 are routed around from the connecting portions to the outer leads toward the connecting portions to the semiconductor element. The inner leads 5 are routed around from the connecting portions to the outer leads 6 located on the short sides to the long side through bending into a direction of about 45 degrees twice to turn 90 degrees. The use of the lead frame 2 having such a shape allows the semiconductor element in the single long side pad structure to be accommodated in the semiconductor device 71 having the outer leads 6 projecting from its both short sides.

The lead frame 2 has adhesive films 72 for fixing the semiconductor element. The adhesive films 72 are adhered at a plurality of locations of the lead frame 2, and part of the adhesive films 72 are adhered to the lead frame 2 to fix portions near the connecting portions of the inner leads 5 to the semiconductor element. The adhesive films 72 also serve as the insulating tapes (lead fixing tapes) 16 in the semiconductor device 1 of the first embodiment. This can increase the bonding property to the inner leads 5 and the handling property of the lead frame.

Figure 26:
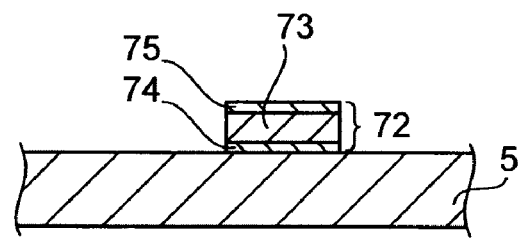
FIG. 26 is a partially sectional view taken along a line A in FIG. 24.
Figure 27:
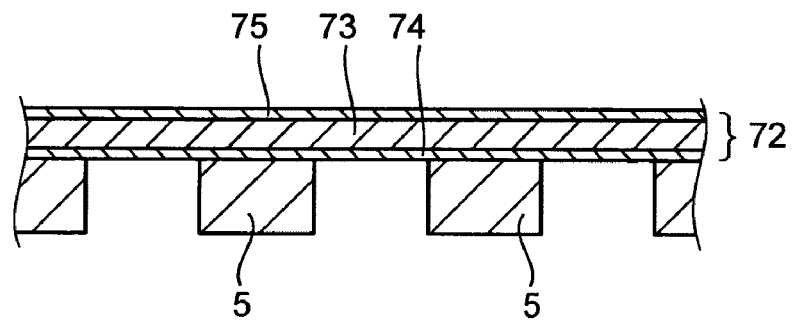
FIG. 27 is a partially sectional view taken along a line B in FIG. 24.
Figure 28:
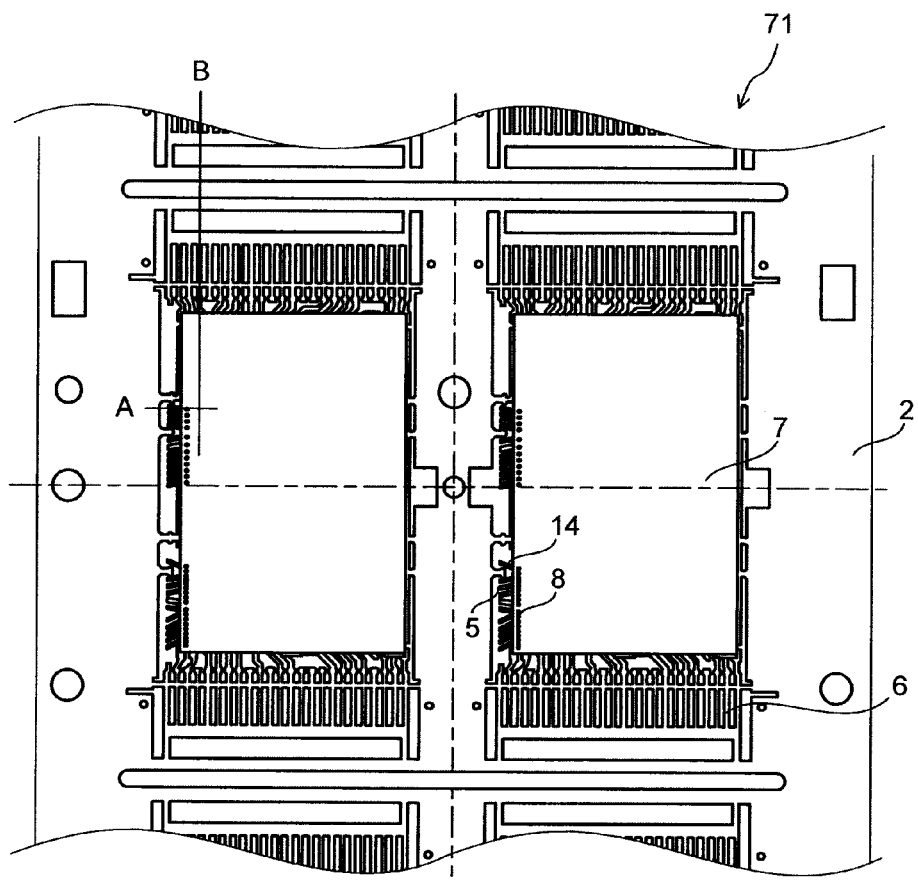
FIG. 28 is a plan view showing a semiconductor device according to a third embodiment.
Figure 29:
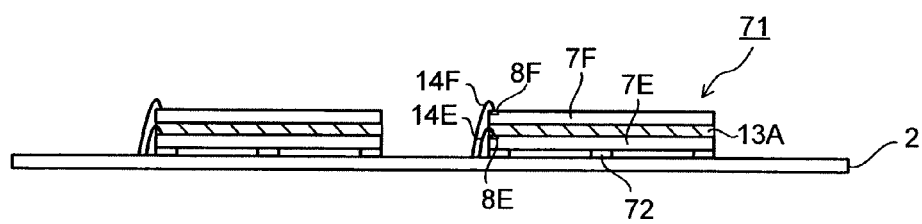
FIG. 29 is a side view of the semiconductor device shown in FIG. 28.
Figure 30:
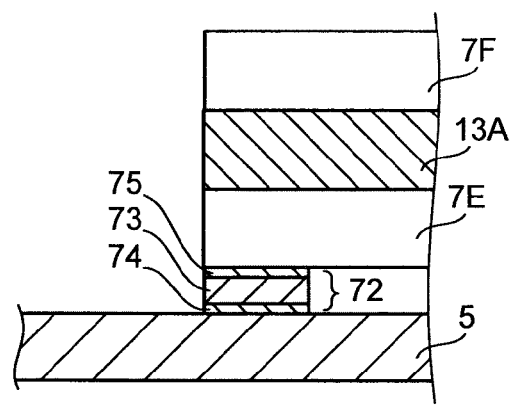
FIG. 30 is a partially sectional view taken along a line A in FIG. 28.
Figure 31:
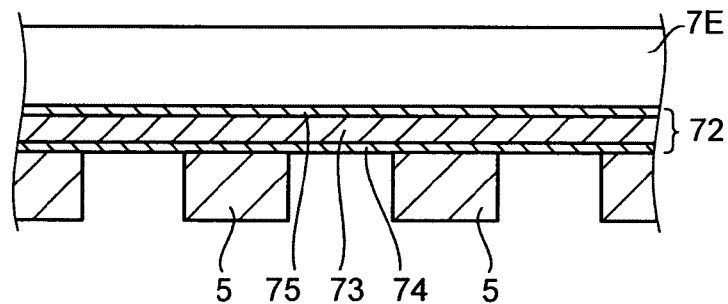
FIG. 31 is a partially sectional view taken along a line B in FIG. 28.

The adhesive film 72 has, as shown in FIG. 26 and FIG. 27, a base film 73, a lead frame adhesive layer 74 formed on one of surfaces of the base film 73, and a semiconductor element adhesive layer 75 formed on the other surface of the base film 73. FIG. 26 and FIG. 27 show a state of the adhesive film 72 adhered to the lead frame 2 using the lead frame adhesive layer 74. In this manner, the adhesive films 72 have been adhered to the lead frame 2 in advance via the lead frame adhesive layers 74.

Conventionally, an adhesive film having the same adhesive applied on both surfaces of the base film has been used. The conventional adhesive film has a problem described below. The adhesion temperature when fixing the semiconductor element to the lead frame with the adhesive films affixed thereto is desirably as low as possible in order to suppress the thermal effect on the semiconductor element. On the other hand, in the wire bonding process of electrically connecting the electrodes pads of the semiconductor element to the inner leads, a temperature of about 250 degrees Celsius is applied to the lead frame having the semiconductor element adhered thereto. The adhesive film needs to have stiffness at the wire bonding temperature in order to suppress the movement of the semiconductor element during the wire bonding.

When it is tried to secure the stiffness at the wire bonding temperature using the thermoplastic adhesive, the adhesion temperature will reach 300 to 400 degrees Celsius, thus inevitably exerting thermal effect on the semiconductor element. Hence, the thermosetting adhesive is used for fixing the semiconductor element. Then, the adhesive layer is generally adhered at a low temperature, and then cured by thermal curing to secure the stiffness at the wire bonding temperature. When affixing the adhesive film to the lead frame, it is preferable to raise the affixing temperature and the cure temperature and increase the cure time for sure adhesion. In this case, however, since the adhesive to adhere the semiconductor element is also cured, the affixing temperature and the cure temperature cannot be raised so high. Similarly, the cure time cannot be increased so long.

Since the adhesive on the lead frame side has not been completely cured at the point in time of affixing the semiconductor element, the adhesive on the lead frame side is also softened by the heat adhering the semiconductor element. In particular, for a pressed frame in which the inner leads are formed by presswork, the inner leads are apt to peel off from the adhesive because the inner leads move in a direction perpendicular to the lead frame surface. If the inner lead peels off from the adhesive, a trouble is caused that when the lead frame after wire bonding is sealed with a mold resin, the peeled off inner lead is carried away by the mold resin into contact with an adjacent inner lead to electrically short out.

Hence, the adhesion temperatures (specifically, cure temperatures) of the lead frame adhesive layer 74 and the semiconductor element adhesive layer 75 are set different in this embodiment. Each of the lead frame adhesive layer 74 and the semiconductor element adhesive layer 75 is formed of a thermosetting adhesive. The cure temperature of the semiconductor element adhesive layer 75 is set higher than that of the lead frame adhesive layer 74. In other words, the lead frame adhesive layer 74 adheres and cures at a lower temperature than that of the semiconductor element adhesive layer 75. Therefore, the semiconductor element adhesive layer 75 hardly cures when the adhesive film 72 is affixed to the lead frame 2. This can prevent a reduction in adhesive strength between the semiconductor element and the lead frame 2.

The lead frame adhesive layer 74 and the semiconductor element adhesive layer 75 are formed of a thermosetting resin composition (an insulating thermosetting adhesive) using, for example, epoxy resin or epoxy modified polyimide resin or the like as a main component. The lead frame adhesive layer 74 and the semiconductor element adhesive layer 75 different in cure temperature can be realized, for example, by changing the amount of cure catalyst (by increasing the amount of cure catalyst of the semiconductor element adhesive layer 75). Alternatively, the lead frame adhesive layer 74 and the semiconductor element adhesive layer 75 may be formed of two kinds of thermosetting resin compositions (thermosetting adhesives) having different cure temperatures.

The cure temperatures of the lead frame adhesive layer 74 and the semiconductor element adhesive layer 75 are set to ensure that the semiconductor element adhesive layer 75 is not cured when the adhesive film 72 is adhered to the lead frame 2, and that the lead frame adhesive layer 74 has cured not to peel off from the lead frame 2 when the adhesive film 72 is adhered to the semiconductor element. For example, it is preferable that when the cure temperature of the semiconductor element adhesive layer 75 is about 150 degrees Celsius, the lead frame adhesive layer 74 cures to some degree at about 100 degrees Celsius into a state not to peel off from the lead frame 2.

Further, the lead frame adhesive layer 74 and the semiconductor element adhesive layer 75 have different colors. For example, the lead frame adhesive layer 74 or the semiconductor element adhesive layer 75 can be colored to be distinguished from the color of the other adhesive (the original color of the adhesive resin). Making the lead frame adhesive layer 74 and the semiconductor element adhesive layer 75 different in color can prevent the semiconductor element adhesive layer 75 from affixing by mistake when the adhesive film 72 is affixed to the lead frame 2.

On the lead frame 2 having the adhesive films 72, a semiconductor element (semiconductor elements 7E and 7F which are stacked through adhesive layer 13A) is mounted as shown in FIG. 28 to FIG. 31. The semiconductor element 7E is adhered to the lead frame 2 using the semiconductor element adhesive layers 75 of the adhesive films 72. Specifically, the semiconductor element 7E is mounted on the semiconductor element adhesive layers 75 of the adhesive films 72, and adhered and cure-processed at a temperature and time according to the cure conditions of the semiconductor element adhesive layers 75. Since the semiconductor element adhesive layers 75 never cure when the adhesive films 72 are adhered to the lead frame 2, the semiconductor element 7E can be adhered to the lead frame 2 with a sufficient strength.

Further, to affix the adhesive films 72 to the semiconductor element 7E, the lead frame adhesive layers 74 have been cured in advance to some extent. This prevents the lead frame adhesive layers 74 from peeling off from the lead frame 2, especially from the inner leads 5. Therefore, such a trouble can be prevented that the inner lead 5 peeled off from the adhesive film 72 is carried away by the mold resin into contact with an adjacent inner lead 5 to electrically short out. In other words, a semiconductor device (semiconductor package) 71 excellent in reliability and manufacturing yield can be provided.

The semiconductor elements 7E and 7F have electrode pads 8E and 8F. The electrode pads 8E and 8F are arranged along one of outer sides of the semiconductor elements 7E and 7F, in particular, one of long sides. In short, the semiconductor elements 7E and 7F have a single long side pad structure. The semiconductor elements 7E and 7F are disposed such that the electrode pads 8E and 8F correspond to the tip portions of the inner leads 5 located on the long side. Accordingly, the outer leads 6 are arranged to project from both short sides of the semiconductor elements 7E and 7F, respectively. The inner leads 5 are routed around from the outer leads 6 toward the connecting portions to the semiconductor elements 7E and 7F (positions corresponding to the long side where the electrode pads 8E and 8F of the semiconductor element 7E and 7F are arranged).

The electrode pads 8E and 8F of the semiconductor elements 7E and 7F mounted on the lead frame 2 are electrically connected to the inner leads 5 via metal wires (Au wires or the like) 14. Further, though not shown in FIG. 28 and FIG. 29, the semiconductor elements 7E and 7F mounted on the lead frame 2 are sealed together with the inner leads 5 and the metal wires 14E and 14F using the mold resin. For the mold resin constituting the resin sealing portion, a thermosetting resin such as a standard epoxy resin or the like is used. These constitute the semiconductor device (semiconductor package) 71. The semiconductor device 71 is suitable for a semiconductor storage device having a semiconductor memory element mounted on the lead frame 2.

It should be noted that the present invention is not limited to the above-describe embodiments, but is applicable to various semiconductor devices in which one or more semiconductor elements are stacked and mounted on a single surface of a lead frame. Such semiconductor devices are also included in the present invention. The embodiments of the present invention can be extended or changed within the technical scope of the present invention, and the extended and changed embodiments are also included in the technical scope of the present invention.

What is claimed is:

1. A semiconductor device, comprising:
a lead frame including an outer lead portion having a plurality of outer leads and an inner lead portion having a plurality of inner leads;
a semiconductor element group including at least one semiconductor element mounted on a lower surface side of the lead frame and having electrode pads;
metal wires which electrically connect the inner leads and the electrode pads of the semiconductor element; and
a resin sealing portion which seals the semiconductor element group together with the metal wires,
wherein the outer leads located at both ends in an arrangement direction of the plural outer leads in the outer lead portion have dambar cut portions and positioning projections, respectively, and
wherein each of the positioning projections is formed at a position on one of the outer leads closer to a tip of the outer lead than the dambar cut portion, and is projected toward an outside of the plural outer leads in the arrangement direction.

2. The semiconductor device as set forth in claim 1, wherein the electrode pads are arranged along one of long sides of the semiconductor element, and the outer leads are disposed to project from sides of the resin sealing portion corresponding to both short sides of the semiconductor element respectively, and the inner leads are routed around from the outer leads toward the long side of the semiconductor element where the electrode pads are arranged.

3. The semiconductor device as set forth in claim 2, wherein the inner leads are bent to be routed around from the outer leads to the long side of the semiconductor element.

4. The semiconductor device as set forth in claim 3, wherein the lead frame has an element support portion disposed in a space provided by bending the inner leads.

5. The semiconductor device as set forth in claim 4, wherein the lead frame is flattened from the element support portion to the inner lead portion.

6. The semiconductor device as set forth in claim 1, wherein the outer leads are bent in a direction which the lower surface of the lead frame faces.

7. The semiconductor device as set forth in claim 1, wherein the semiconductor element group includes a plurality of the semiconductor elements.

* * * * *